(12) United States Patent
Nara et al.

(10) Patent No.: US 7,665,510 B2
(45) Date of Patent: Feb. 23, 2010

(54) FLUID DRIVE UNIT AND HEAT TRANSPORT SYSTEM

(75) Inventors: Kenichi Nara, Ooby (JP); Seiji Inoue, Nukata-gun (JP); Yasumasa Hagiwara, Kariya (JP); Kimio Kohara, Nagoya (JP); Nobunao Suzuki, Toyohashi (JP)

(73) Assignee: Denso Corporation, Kariya (JP)

( * ) Notice: Subject to any disclaimer, the term of this patent is extended or adjusted under 35 U.S.C. 154(b) by 858 days.

(21) Appl. No.: 10/786,912

(22) Filed: Feb. 25, 2004

(65) Prior Publication Data

US 2004/0170513 A1 Sep. 2, 2004

(30) Foreign Application Priority Data

| Feb. 28, 2003 | (JP) | ............................. 2003-054582 |
| Nov. 11, 2003 | (JP) | ............................. 2003-381437 |

(51) Int. Cl.
*F04B 17/04* (2006.01)
*F28D 15/00* (2006.01)
*F28F 7/00* (2006.01)

(52) U.S. Cl. .................................. 165/104.28; 417/417

(58) Field of Classification Search ................ 165/80.4, 165/104.28, 104.31; 417/416–418; 318/119, 318/121, 128, 130
See application file for complete search history.

(56) References Cited

U.S. PATENT DOCUMENTS

| 2,690,128 | A | * | 9/1954 | Basilewsky ................. 417/326 |
| 3,740,171 | A | * | 6/1973 | Farkos .......................... 417/418 |
| 3,791,770 | A | * | 2/1974 | Farkos .......................... 417/418 |
| 4,395,649 | A | | 7/1983 | Thome et al. |
| 4,613,285 | A | | 9/1986 | Sato et al. |

(Continued)

FOREIGN PATENT DOCUMENTS

EP 0 580 117 1/1994

(Continued)

OTHER PUBLICATIONS

Electric Academic Conference Magnetics Linear Drive Study Club document, publication date Sept. 7, 1994, Aggregate Corporation Electric Academic Conference, Oct. 1994, MAG-94-118, LD-94-63, p. 1-7, with English translation.

(Continued)

*Primary Examiner*—Tho v Duong
(74) *Attorney, Agent, or Firm*—Harness, Dickey & Pierce, PLC

(57) ABSTRACT

The fluid drive unit includes a cylinder communicating with both end portions of a meandering passage formed in the heat transport device. In the cylinder, the piston is slidably arranged being capable of sliding in the axial direction. Fluid is charged in the spaces, which are provided on both sides of the piston, connected to the meandering passage. The solenoid coil, which is provided in the periphery of the side of the cylinder, periodically inverts the magnetic poles and reciprocates the piston in the cylinder. To drive the piston smoothly and reduce the amount of eccentricity, a pair of sliding members are provided at the end portions of the piston. When the fluid in the passage is vibrated by the movement of the piston, the apparent heat conductivity of the heat transport device is enhanced, and heat is quickly diffused from the heating body to the radiating portion.

19 Claims, 23 Drawing Sheets

U.S. PATENT DOCUMENTS

| | | | |
|---|---|---|---|
| 4,692,673 A * | 9/1987 | DeLong | 318/132 |
| 4,799,421 A * | 1/1989 | Bremer et al. | 92/162 R |
| 5,005,639 A * | 4/1991 | Leland | 165/104.25 |
| 5,013,223 A | 5/1991 | Takahashi et al. | |
| 5,238,056 A * | 8/1993 | Scotti et al. | 165/109.1 |
| 5,779,455 A | 7/1998 | Steiger | |
| 6,684,941 B1 * | 2/2004 | Cao et al. | 165/104.25 |
| 6,960,847 B2 | 11/2005 | Suzuki et al. | |
| 7,145,423 B2 | 12/2006 | Suzuki et al. | |
| 2002/0189792 A1 | 12/2002 | Nishio et al. | |

FOREIGN PATENT DOCUMENTS

| | | |
|---|---|---|
| JP | 3-104188 | 10/1991 |
| JP | 04027773 A * | 1/1992 |
| JP | 5-12675 | 2/1993 |
| JP | 07-274468 | 10/1995 |
| JP | 11-018396 | 1/1999 |
| JP | 11-155273 | 6/1999 |
| JP | 2000-018742 | 1/2000 |
| JP | 2001-183063 | 7/2001 |
| JP | 2001-339931 | 12/2001 |
| JP | 2002-257232 | 9/2002 |
| JP | 2002-364634 | 12/2002 |
| JP | 2002-364991 | 12/2002 |

OTHER PUBLICATIONS

Office action dated Jul. 08, 2008 in Japanese application No. 2003-381437 with English translation thereof.

* cited by examiner

Fig. 2
(A)
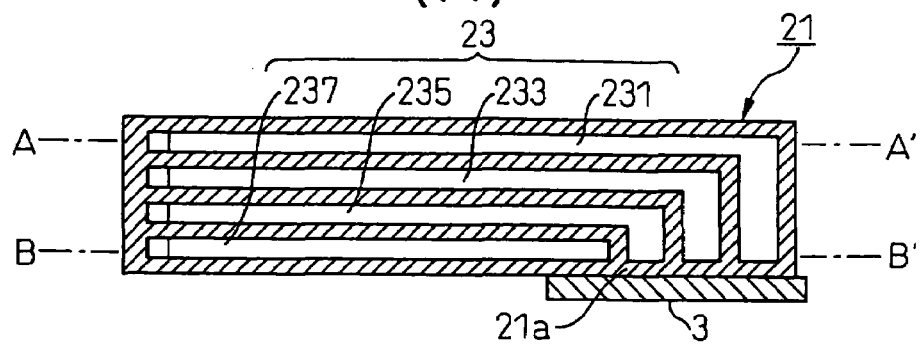
(B)
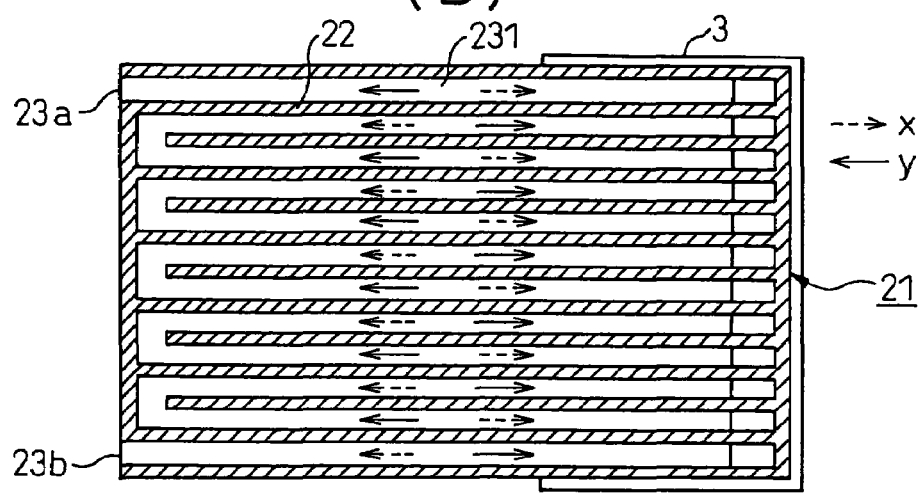
(C)
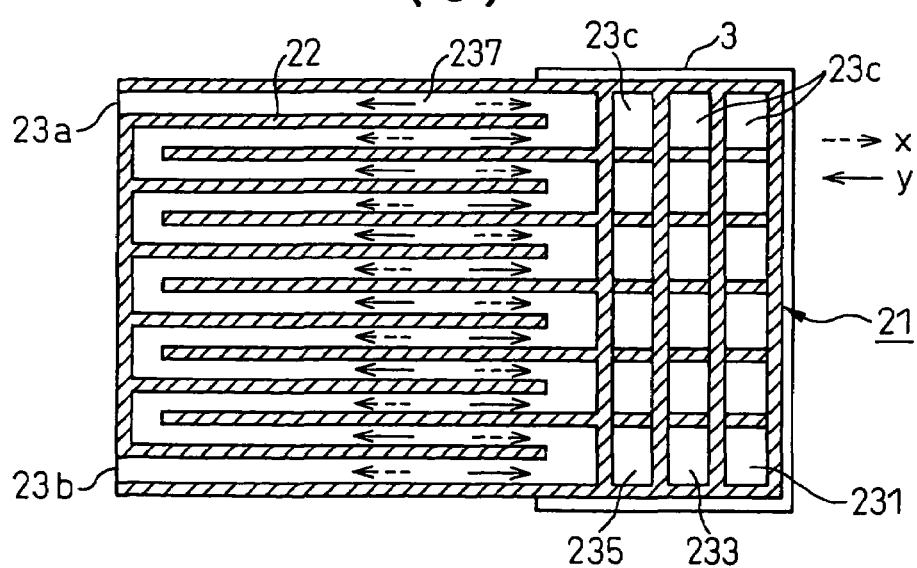

Fig.12
(A)
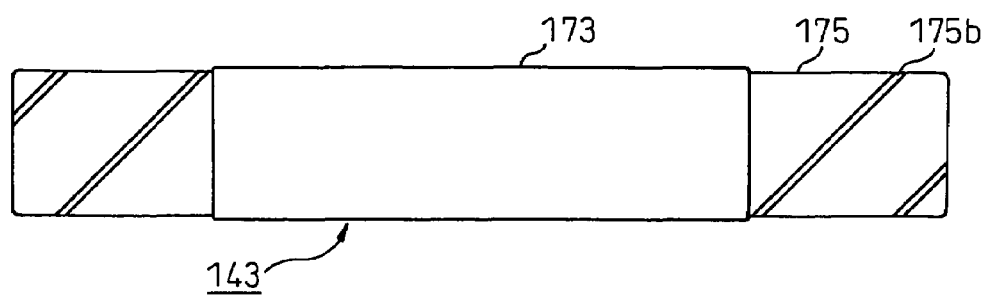
(B)
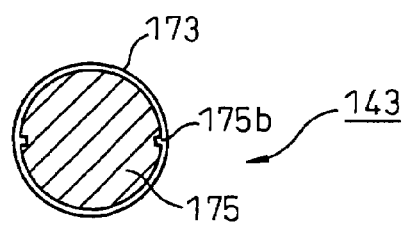
(C)
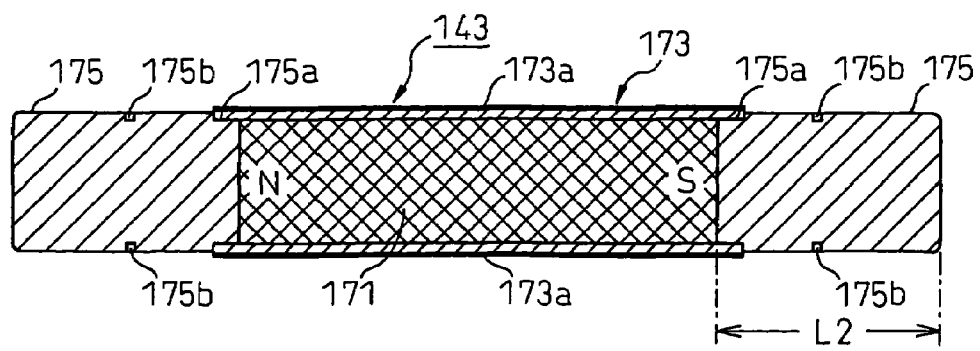

Fig. 14
(A)
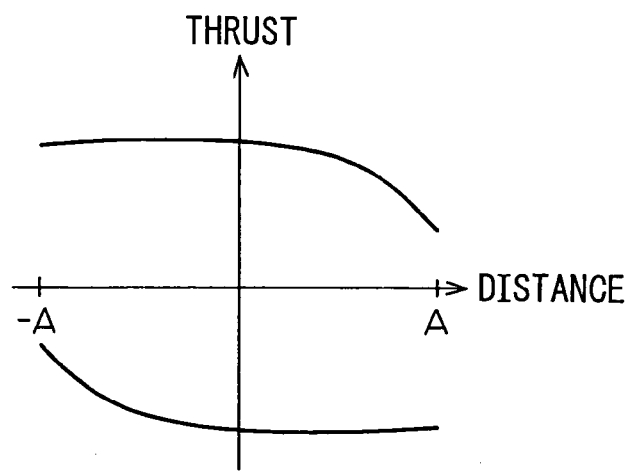
(B)
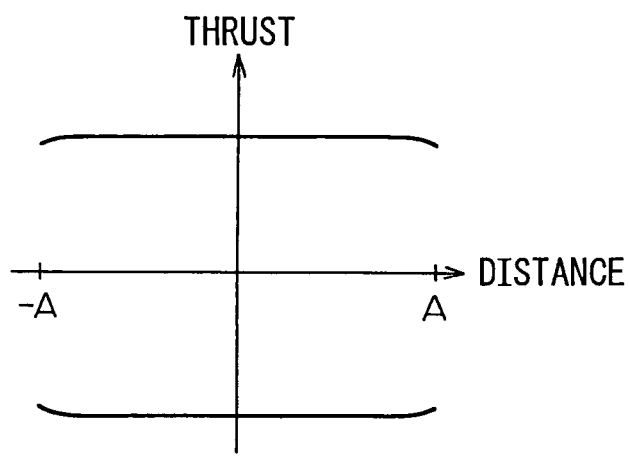
(C)
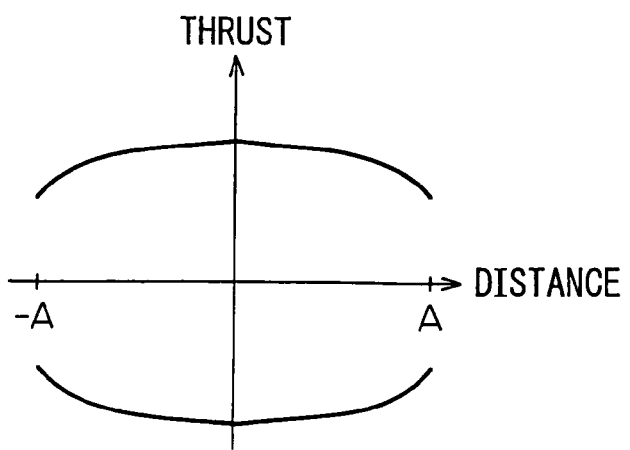

Fig.15
(A)
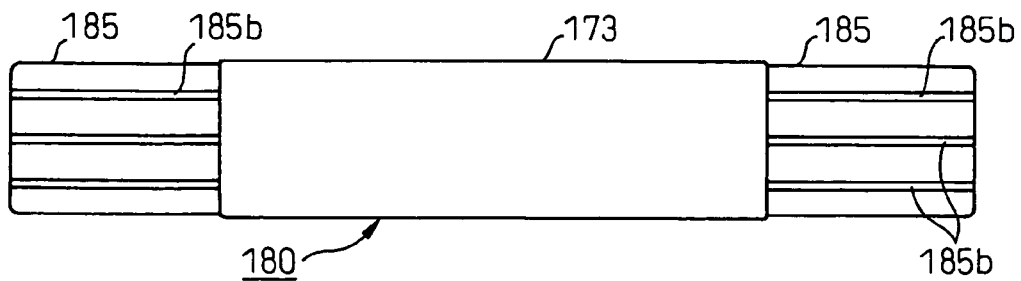
(B)
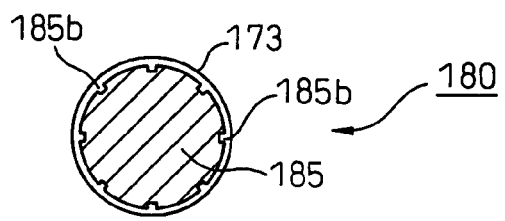
(C)
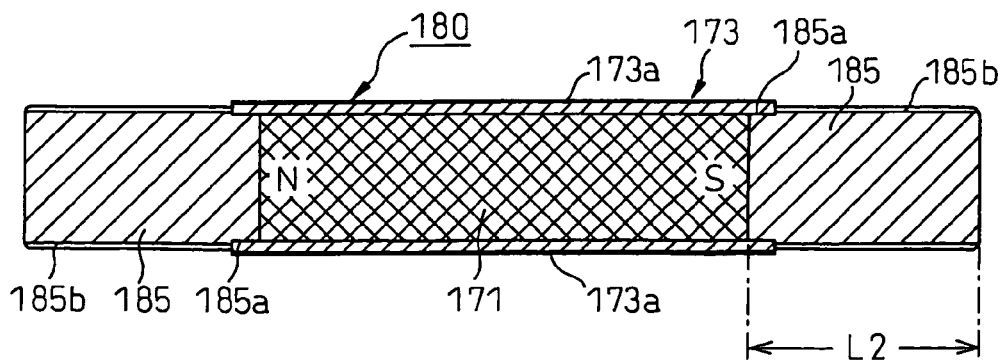

Fig.16
(A)
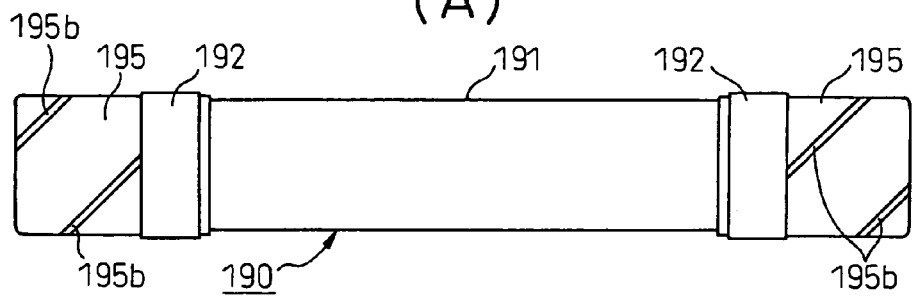
(B)
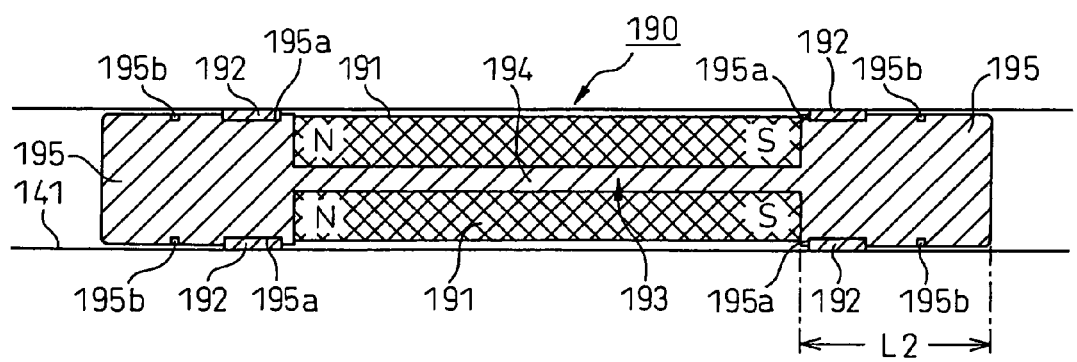
(C)
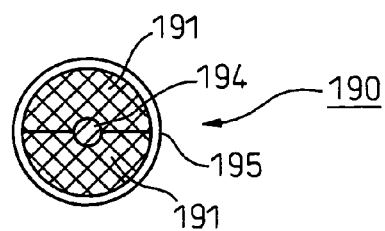

Fig.17
(A)
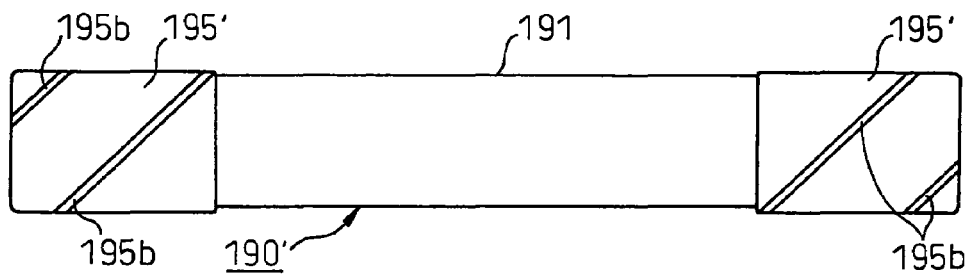
(B)
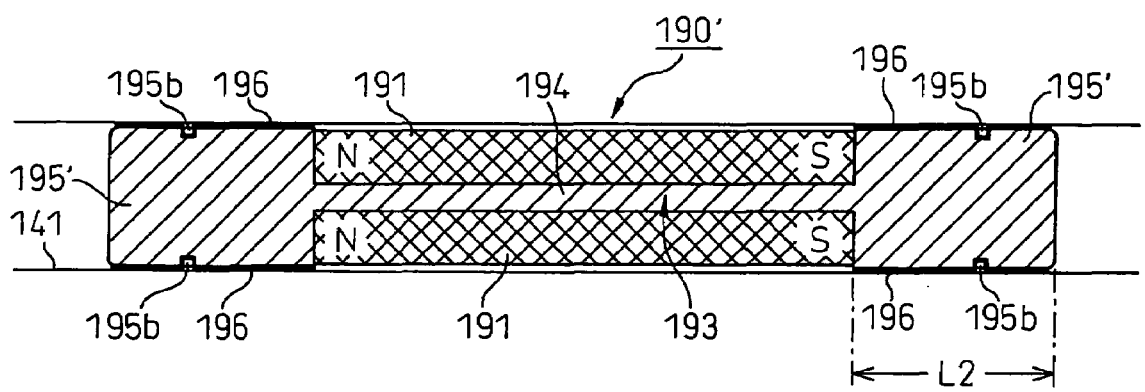
(C)
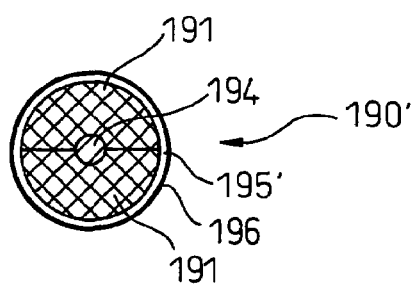

Fig.18
(A)
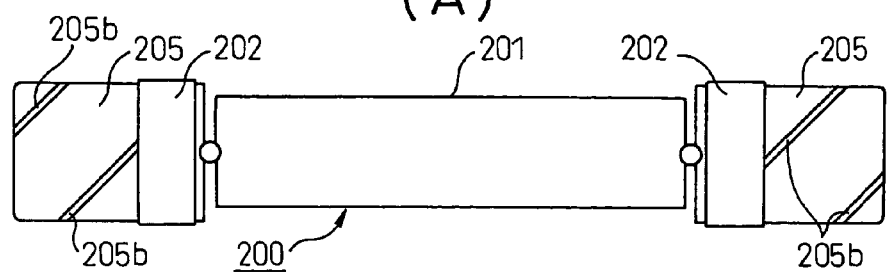
(B)
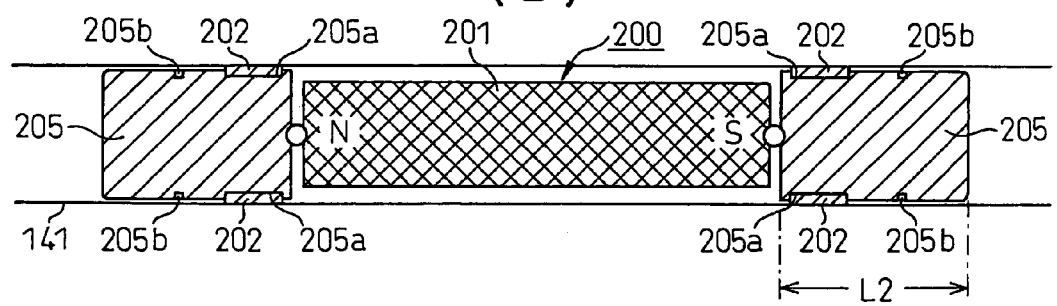
Fig.19
(A)
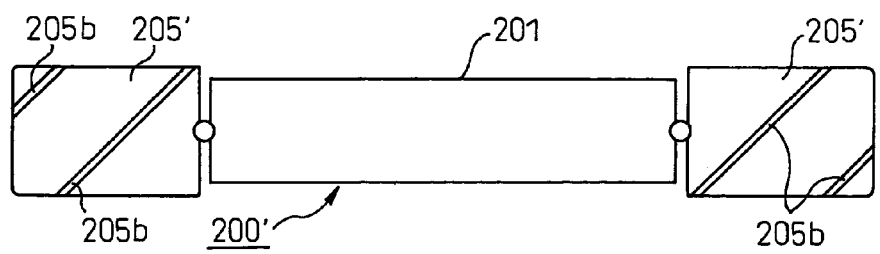
(B)
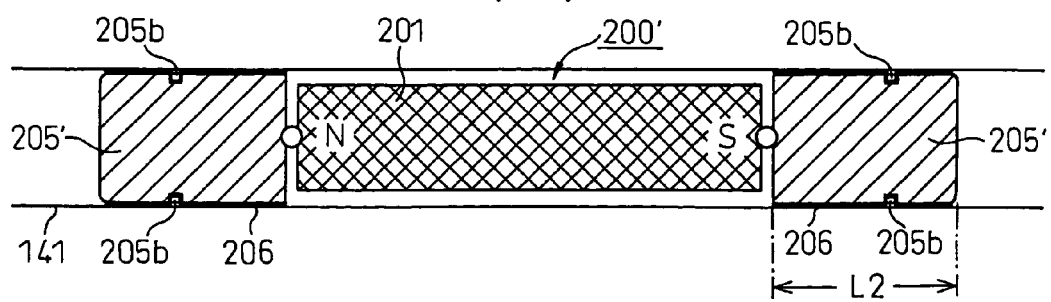

Fig. 23
(A)
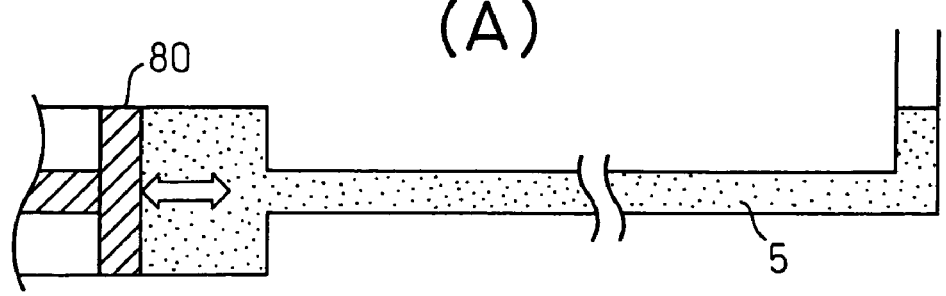
(B)
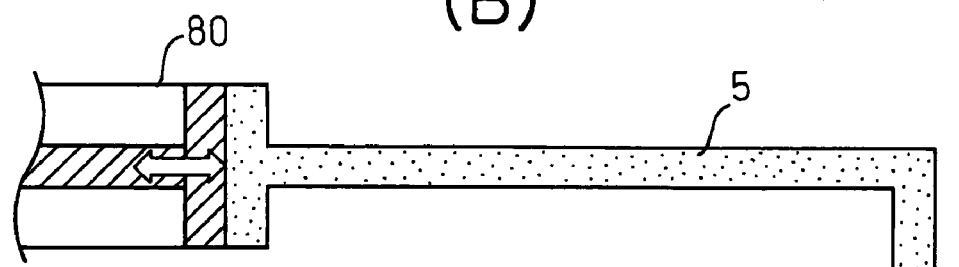
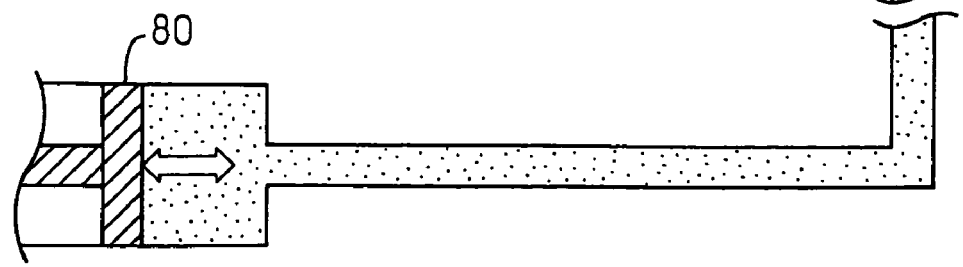

FLUID DRIVE UNIT AND HEAT TRANSPORT SYSTEM

BACKGROUND OF THE INVENTION

1. Field of the Invention

The present invention relates to a fluid drive unit for vibrating fluid, which is charged in a passage, in the direction of the passage. The present invention also relates to a heat transport system in which the fluid drive unit is used.

2. Description of the Related Art

As is well known, heat is conducted from a high temperature portion to a low temperature portion in proportion to temperature gradient ΔT according to the Fourier's Law. In this case, the proportional constant is referred to as heat conductivity, which changes according to the medium in which heat is conducted. However, even in mediums including gas, liquid and solid, heat conductivity changes only by five digits. Therefore, when heat is transported, the quantity of heat to be transported is restricted.

In order to overcome this problem, investigations have been recently made into a method in which heat is efficiently transported by vibrating a fluid. This method of transporting heat utilizes the following principle. In this connection, FIGS. 22A, 22B and 22C are schematic illustrations to show the principle of transporting heat.

In order to briefly explain this principle, the following circumstances are established. Fluid is filled in a circular tube, and vibration center C of the fluid in the circular tube is set as a reference point. A low temperature portion is present at point L on the left of center C, and a high temperature portion is present at point H on the right of center C. A portion of the fluid, which is present at vibration center C in the case where no vibration is caused, is defined as element E. In the above circumstances, consideration is given to a rectangular wave vibration in which the element E stays at point H for a half period and immediately moves to point L and stays there for a half period and then immediately returns to point H. In this connection, the position of element E in the case where no vibration is given is shown in FIG. 22A. The moving direction of heat in the case where element E is moved to the high temperature portion is shown by an arrow (solid line) in FIG. 22B. The moving direction of heat in the case where element E is moved to the low temperature portion is shown by an arrow (solid line) in FIG. 22C.

In this model, heat is moved as follows. When element E, which is present at center C in the case where no vibration is caused, is moved to point H, since the temperature of the circular tube wall at point H is higher than the temperature of element E, element E is given heat from the circular tube wall. When element E is moved by vibration from point H to point L, since the temperature of the circular tube wall at point L is lower than the temperature of element E, element E discharges heat to the circular tube wall.

As described above, heat on the circular tube wall at point H is quickly transported to the circular tube wall at point L via the vibrating fluid (element E). If no vibration is caused, heat is continuously and gradually moved from point H to point L. Therefore, the heat conductivity in this case is much lower than the heat conductivity in the case where the fluid is given vibration. In other words, when the fluid in the circular tube is vibrated, the apparent heat conductivity can be greatly enhanced.

When this heat transport method is used, for example, heat generated from a microprocessor can be quickly diffused. Therefore, it is possible to overcome a problem caused by heat generated in the microprocessor of the note type personal computer.

According to this heat transport method, when the amplitude and period are changed, the apparent heat conductivity can be freely changed. When this function is utilized, for example, when vibration given to the fluid is turned on and off, it becomes possible to make a new device having a heat switch by which heat transport can be turned on and off, which is very convenient.

In this connection, the heat transport system using this heat transport method is in the first stage of development. Therefore, it is necessary for the present inventors to develop a fluid drive unit suitable for used in the heat transport system. In this connection, a pump device such as an actuator, which is operated while being vibrated linearly and used for an artificial heart, is well known as a fluid drive unit.

However, in the heat transport system of the aforementioned principle, fluid is vibrated so as to transport heat, which is a method not used in the conventional heat transport system. Therefore, when only the conventional method of driving fluid is applied to the heat transport system, various problems may be caused.

For example, in the case of vibrating fluid by the conventional method, it is possible to consider a method in which the pump device 80 is connected to one side of the passage as shown in FIG. 23A and the fluid 5 is vibrated from one end of the passage. However, when this method is employed, the following problems may be encountered. Specifically, when this method is employed, a large pressure loss occurs. Therefore, it is difficult to drive the fluid 5 which is charged at an end portion distant from the pump device 80. In particular, when the fluid 5 is sucked to the pump device 80 side, since the fluid 5 charged at the end portion cannot be appropriately sucked to the pump device 80 side, the phenomenon of cavitation occurs in the passage, i.e. bubbles are generated in the passage of the fluid. Further, according to this structure, it is impossible to close the end portion of the passage, and the end portion of the passage cannot be directed downward; in other words, the profile of the passage is restricted.

On the other hand, as shown in FIG. 23B, when the heat transport system is composed in a manner such that two pump devices 80 are respectively arranged at both end portions of the passage and the fluid 5 is driven by the two pump devices 80, it is possible to drive the fluid 5 without causing the phenomenon of cavitation. However, this method has the following disadvantages. According to this system, since the two pump devices 80 are used, the manufacturing cost is raised. Further, since it is necessary to drive the two pump devices 80 synchronously, control of the pump devices 80 becomes complicated.

SUMMARY OF THE INVENTION

The present invention has been accomplished to solve the above problems. It is a first object of the present invention to provide a fluid drive unit suitably used for vibrating a fluid charged in a passage in the direction of the passage. It is a second object of the present invention to provide a heat transport system, the performance of which is high, for transporting heat by vibrating the fluid with the fluid drive unit.

According to a first aspect of the present invention, a fluid drive unit for vibrating the fluid, which is charged in a passage, in the direction of the passage includes: a moving piece; a moving piece accommodating portion for accommodating the moving piece; and a drive means for reciprocating the moving piece.

The moving piece accommodating portion is provided with spaces which respectively communicate with both end portions of the passage. The moving piece accommodating portion slidably accommodates the moving piece and also accommodates the fluid, which is charged in the passages, in the above spaces interposed between both end portions of the moving piece and the end portions of the passages. The drive means reciprocates the moving piece in the moving piece accommodating portion in the sliding direction, so that the fluid accommodated in the above spaces adjacent to both end portions of the moving piece can be driven. In other words, in the fluid drive unit of the present invention, when the moving piece is reciprocated with the drive means, the fluid charged in the passage can be vibrated in the direction of the passage.

In the fluid drive unit of the first aspect composed as described above, according to a moving distance of the moving piece, the fluid is discharged into the passage from one end of the moving piece accommodating portion, and the fluid of the same volume is sucked from the passage from the other end portion. Therefore, even when the moving piece is reciprocated, the volume of the fluid in the passage does not change. Accordingly, no cavitation is created in the passage. Consequently, according to the fluid drive unit of the present invention, it is possible to suppress the occurrence of vibration and noise caused by cavitation. Therefore, the fluid in the passage can be precisely and appropriately vibrated.

According to the present invention, it is not necessary to provide a plurality of pump mechanisms in the unit. when only a single moving piece is reciprocated in the moving piece accommodating portion, the fluid charged in the passage can be appropriately vibrated. Accordingly, synchronization of the drive means, which is necessary for synchronizing a plurality of pump mechanisms (shown in FIG. 23B), is not required. As a result, according to the present invention, it is possible to provide an inexpensive fluid drive unit in which the moving piece can be driven being simply controlled and the fluid can be appropriately vibrated.

According to the fluid drive unit of the present invention, since both end portions of the passage communicate with the moving piece accommodating portion, a closed space can be formed by the passage and the moving piece accommodating portion, and the fluid to be driven can be accommodated in the closed space. Therefore, the fluid can be easily prevented from flowing outside.

According to the present invention, even when the moving piece is reciprocated, the volume of the space in which the fluid exists can be kept constant. Therefore, even if the above airtightly closed space is formed, there is no possibility of the occurrence of cavitation, which is caused when pressure in the passage is decreased. Accordingly, the fluid drive unit of the present invention can be suitably used in the heat transport system for transporting heat.

In this connection, in the fluid drive unit of the first aspect, for example, the moving piece accommodating portion is composed of a cylinder, and the cylinder may communicate with both end portions of the passage. In the fluid drive unit of the second aspect composed as described above, the moving piece, which is composed as a piston, is reciprocated in the cylinder in the axial direction of the cylinder, so that the fluid flowing from the passage into the cylinder is sent out into the passage by the moving piece. According to this invention, the fluid drive unit of the first aspect can be made by a simple structure. Therefore, it is possible to provide an inexpensive fluid drive unit which can be suitably used in the heat transport system.

In this connection, in the fluid drive unit of the present invention, a sliding member may be provided in the moving piece, and a sliding face of the moving piece coming into contact with the inner wall of the moving piece accommodating portion may be composed of this sliding member. According to the fluid drive unit of the third aspect composed as described above, the moving piece can be smoothly driven without provision of a bearing on the inner wall of the moving piece accommodating portion. Therefore, the manufacturing cost of the fluid drive unit can be reduced, and further, the durability of the fluid drive unit can be enhanced.

In this connection, examples of the material of the sliding member are: Teflon (registered trademark), carbon and material plated with nickel. It is preferable to use material plated with nickel phosphorus (NiP). In particular, in the heat transport system, the type of fluid is restricted so as to obtain a sufficiently high heat transport capacity. Therefore, it is preferable to use the above material, the sliding capacity of which is high.

Like the fourth aspect, the above sliding members may be respectively arranged symmetrically at positions on both sides of the moving piece in the sliding direction. When a pair of the sliding members are arranged at positions symmetrical to each other with respect to the center of the moving piece like the fluid drive unit of the fourth aspect and the sliding faces of the moving piece are formed at the positions, it is possible to prevent the moving piece from moving eccentrically. Consequently, according to this fluid drive unit, the moving piece can be appropriately reciprocated in the sliding direction. In this connection, it is more preferable that the sliding members be arranged at both end portions of the moving piece. When the sliding members are arranged at both end portions of the moving piece, the amount of eccentricity of the moving piece can be further reduced.

In the fluid drive unit of the present invention, as shown in the fifth aspect, the drive means may be composed in a manner such that a magnetic body is provided in the moving piece so that the moving piece can be reciprocated by magnetic force. According to the fluid drive unit of the fifth aspect composed as described above, the drive means is arranged outside the moving piece accommodating portion, and a magnetic field is formed in the moving piece accommodating portion by this drive means, so that the moving piece can be reciprocated. Therefore, according to the present invention, it is not necessary to provide a complicated mechanism and electric structure in the moving piece accommodating portion. Accordingly, it is not necessary to use a large number of sealing members for preventing occurrence of a short circuit. As a result, the manufacturing cost of the fluid drive unit can be reduced.

In this fluid drive unit, as shown in the sixth aspect, a sliding member may be arranged around the magnetic body. Since a thrust generated by the moving piece acts on the periphery of the magnetic body, when the sliding member is arranged round the magnetic body, the moving piece can be driven smoothly, and the amount of eccentricity can be reduced.

As the above magnetic body, a permanent magnet may be arranged in the moving piece. According to the fluid drive unit of the seventh aspect composed as described above, the moving piece can be driven with high efficiency. When magnetic poles are arranged in the moving piece, the moving piece can be driven smoothly in a desired direction.

As described in the eighth aspect, the drive means includes an annular exciting coil which surrounds the side of the moving piece accommodating portion in the sliding direction of the moving piece, and a magnetic flux is formed in the moving piece accommodating portion with the exciting coil and the moving piece is reciprocated by a magnetic force generated by the exciting coil. Further, it is preferable that the drive means in the fluid drive unit of the eighth aspect be composed as described in the ninth aspect.

The drive means in the fluid drive unit of the ninth aspect includes an electromagnet composed of an annular exciting coil, which surrounds the side of the moving piece accommodating portion in the sliding direction of the moving piece, and a yoke, which surrounds the outer circumference of the exciting coil, for forming a magnetic passage. The yoke is provided on the outer circumference of the exciting coil and forms a magnetic pole opposed to the side of the moving piece accommodating portion. The drive means generates a magnetic flux in the moving piece sliding direction in the moving piece accommodating portion by this electromagnet. The moving piece is reciprocated in the moving piece accommodating portion when the electromagnet is periodically inverted.

According to the fluid drive unit of the ninth aspect composed as described above, it is not necessary to provide a complicated mechanism and electric structure in the moving piece accommodating portion, and it is also not necessary to use a large number of sealing members for preventing occurrence of a short circuit. Therefore, the manufacturing cost of the fluid drive unit can be reduced. Further, since the exciting coil is used, the drive means can be composed of parts, the number of which is small. Furthermore, the state of driving the moving piece can be freely controlled.

In this connection, in order to make the thrust act on the moving piece effectively, it is preferable that the distance between the yoke, in which the magnetic poles are formed, and the magnetic body of the moving piece be reduced, i.e. it is preferable that the moving piece accommodating portion be composed of a material of low thickness. However, when the moving piece accommodating portion is composed of the material of low thickness, bending stress is applied to the moving piece accommodating portion by the weight of the yoke. Accordingly, there is a possibility that the durability of the moving piece accommodating portion will deteriorate. Further, when the moving piece accommodating portion is deformed by the weight of the yoke, the moving piece cannot be driven smoothly.

Accordingly, in the fluid drive unit of the ninth aspect, it is preferable that a yoke connecting member, which fixes the yoke to the periphery of the moving piece accommodating portion in a state of non-contact with respect to the moving piece accommodating portion, be fixed to both end portions of the moving piece accommodating portion. According to the fluid drive unit of the tenth aspect composed as described above, the weight of the yoke can be supported by both end portions of the moving piece accommodating portion (cylinder). Therefore, the intensity of the bending stress acting on the moving piece accommodating portion (cylinder) by the weight of the yoke can be reduced. A gap may not be necessarily provided, and the moving piece accommodating portion and the yoke of the electromagnet may be formed being integrated into one body so as to suppress the intensity of bending stress.

The exciting coil in the fluid drive unit of the ninth and the tenth aspects is preferably fixed to the yoke under the condition wherein a gap is formed with respect to the side of the moving piece accommodating portion like the eleventh aspect. When the exciting coil, which becomes a heating source, comes into contact with the side of the moving piece accommodating portion, heat generated from the exciting coil is conducted to the fluid in the moving piece accommodating portion. Accordingly, when this constitution of the fluid drive unit is applied to the heat transport system, the performance of heat transport may be affected by the heat generated in the exciting coil. On the other hand, when a gap is formed between the exciting coil and the moving piece accommodating portion like in the eleventh aspect, heat generated from the exciting coil is unlikely to be diffused to the moving piece accommodating portion, and the performance of the heat transport system can be maintained.

In the case of employing the method of reciprocating the moving piece by magnetic force, it is difficult to form a point, which is stable from the viewpoint of energy, at the vibration center of the moving piece. In particular, in the fluid drive unit of the ninth aspect, even when the exciting coil is not energized, the moving piece is subjected to a detent force by which the moving piece is moved to a position which is magnetically stable, outside of the exciting coil in the axial direction.

Accordingly, as shown in the twelfth aspect of the present invention, it is preferable that the fluid drive unit of the present invention include: a moving piece, the end portion of which is pushed; a spring member for slidably arranging the moving piece at a predetermined position in the moving piece accommodating portion; and a spring engaging portion for fixing the spring member in the moving piece accommodating portion being pushed. According to this fluid drive unit, the moving piece can be stably arranged at a predetermined position by the pushing force of the spring member, and the detent force can be canceled. In this connection, the spring member may be arranged on one end portion of the moving piece. Alternatively, the spring member may be arranged on both end portions of the moving piece.

In the fluid drive unit of the fifth to the twelfth aspects, at positions which are distant from each other by a predetermined interval in the sliding direction of the moving piece, a pair of permanent magnets may be arranged so that the same type magnetic poles (N-pole or S-pole) are opposed to each other. According to the fluid drive unit of the thirteenth aspect composed as described above, since the magnetic poles of the same type are arranged on both end sides of the moving piece in the sliding direction, when a magnetic flux, which flows from one end side to the other end side of the moving piece, is formed by the drive means (for example, the drive means provided in the fluid drive unit of the ninth aspect), a repulsing force acts on one end side of the moving piece, and an attracting force acts on the other end side of the moving piece. Therefore, according to the fluid drive unit of the thirteenth aspect, the moving piece can be reciprocated with high efficiency.

When this moving piece is composed as shown in the fourteenth aspect, the assembling property can be enhanced, which is convenient. The moving piece in the fluid drive unit of the fourteenth aspect, under the condition wherein a permanent magnet is interposed between the moving piece central portion composing member, which composes the moving piece central portion, and the moving piece end portion composing member, which composes the moving piece end portion, the moving piece central portion composing member, the permanent magnet and the moving piece end portion composing member are connected to each other by screws. When the moving piece is composed as described above, the permanent magnet can be positioned and fixed with ease, and the moving piece of the thirteenth aspect can be formed simply. Accordingly, it is possible to manufacture the fluid drive unit at a low manufacturing cost.

In this fluid drive unit, the pair of permanent magnets may be arranged at positions symmetrical to each other with respect to the center of the moving piece. According to the fluid drive unit of the fifteenth aspect composed as described above, the amount of eccentricity can be reduced. Since the thrust of the moving piece acts on the periphery of the permanent magnet by the drive means, when a sliding member is arranged in the periphery of the permanent magnet, the moving piece can be driven smoothly.

The fluid drive unit of the fifth to the seventh aspects may be composed in a manner such that a pair of annular exciting coils, which surround the side of the moving piece accommodating portion in the moving piece sliding direction, are arranged, and the pair of annular exciting coils are arranged in parallel to the sliding direction of the moving piece, and the moving piece is reciprocated by magnetic force generated by the pair of annular exciting coils (the sixteenth aspect). This fluid drive unit can be composed as shown in the seventeenth aspect.

In the fluid drive unit of the seventeenth aspect, the moving piece can be reciprocated in the moving piece accommodating portion in a region surrounded by the end portion of one exciting coil on the passage side and the end portion of the other exciting coil on the passage side. When the fluid drive unit is composed as described above, the unit can be reduced in size. Further, the moving piece can be driven efficiently.

In the fluid drive units of the first to the eighth aspects and the sixteenth and the seventeenth aspects, the moving piece can be composed as shown in the eighteenth aspect. The moving piece of the fluid drive unit of the eighteenth aspect includes temporary magnets as the magnetic body at both end portions in the sliding direction. The moving piece of the fluid drive unit of the eighteenth aspect also includes a permanent magnet interposed between the temporary magnets which are arranged at both end portions. The moving piece having the above structure may be used especially for the fluid drive units of the sixteenth and the seventeenth aspects. When the moving piece of the eighteenth aspect is used for the sixteenth and the seventeenth aspects, the moving piece can be reciprocated highly precisely.

In the sixteenth and the seventeenth aspects, the moving piece may be composed as shown in the nineteenth aspect. The moving piece of the fluid drive unit of the nineteenth aspect includes temporary magnets as the magnetic body at both end portions in the sliding direction. The moving piece of the fluid drive unit of the nineteenth aspect also includes a permanent magnet interposed between the temporary magnets which are arranged at both end portions. The length of each temporary magnet in the sliding direction of this moving piece is less than the length of the exciting coil in the sliding direction of the moving piece.

According to the fluid drive unit of the nineteenth aspect, irrespective of the position (located in the sliding range) of the moving piece, the thrust can be directed equally substantially to the moving piece. Therefore, the moving piece can be reciprocated regularly and accurately. Since high intensity thrust can be directed uniformly, the fluid drive unit can be reduced in size, and thus electric power consumption reduced.

In this connection, in order to direct thrust of uniform intensity with higher accuracy to the moving piece, it is preferable that the length of the temporary magnet in the sliding direction of the moving piece be set at 16% to 42% of the length of the exciting coil in the sliding direction of the moving piece. According to the fluid drive unit of the twentieth aspect composed as described above, a distribution of thrust with respect to the position of the moving piece can be made flat. Therefore, thrust of uniform intensity can be accurately directed to the moving piece, irrespective of the position of the piece.

It is more preferable that the length of the temporary magnet in the sliding direction of the moving piece be set at 25% of the length of the exciting coil in the sliding direction of the moving piece. According to the fluid drive unit of the twenty-first aspect composed as described above, a more uniform intensity of thrust can be directed to the moving piece, and thus the moving piece can be reciprocated highly accurately.

Concerning the permanent magnet, it is difficult to ensure a higher dimensional accuracy with this than the dimensional accuracy of the other members. Therefore, in the fluid drive units of the eighteenth to the twenty-first aspects, the moving piece may be composed as shown in the twenty-second aspect. The moving piece of the fluid drive unit of the twenty-second aspect is composed in a manner such that the permanent magnet is arranged on the center side (inside) of the moving piece with respect to the outermost face of the temporary magnet in the radial direction perpendicular to the sliding direction of the moving piece.

According to this fluid drive unit, since the permanent magnet arranged in the moving piece does not contact the inner wall of the moving piece accommodating portion, dimensional errors in the permanent magnet do not directly affect the performance of the moving piece. Therefore, according to the present invention, it is possible to increase the dimensional tolerance of the permanent magnet used for manufacturing the moving piece.

In the fluid drive unit of the eighteenth to the twenty-second aspects, the moving piece may be composed as shown in the twenty-third aspect. The moving piece of the fluid drive unit of the twenty-third aspect includes a cylinder for accommodating the permanent magnet, and the permanent magnet is accommodated in the cylinder and a pair of temporary magnets are arranged opposed to each other at both end portions of the permanent magnet in the sliding direction of the moving piece.

According to the fluid drive unit of the twenty-third aspect, since the permanent magnet is accommodated in the cylinder, even if dimensional errors in the permanent magnet are substantial, high dimensional accuracy of the moving piece can be ensured. In other words, when the permanent magnet is exposed to the surface of the moving piece, a difference arises between the profiles of the moving piece according to the dimensional accuracy of the permanent magnets. However, when the permanent magnet is accommodated in the cylinder, the magnet is not exposed to the surface of the moving piece. Therefore, the profile of the moving piece can be made uniform for each individual body. Accordingly, the performance of the fluid drive unit can be made uniform. Therefore, according to the present invention, the dimensional tolerance of the permanent magnet can be increased. It is possible to suppress the progress of corrosion as the permanent magnet comes into contact with the fluid charged into the moving piece accommodating portion. Therefore, according to the fluid drive unit of the twenty-third aspect, the yield of manufacturing products can be enhanced, and it is possible to provide products of high quality, the durability of which is high, at a low cost.

The moving piece may be composed as shown in the twenty-fourth aspect. The moving piece body of the twenty-fourth aspect includes: temporary magnets arranged at both end portions of the moving piece body; and connection bodies connected with the temporary magnets arranged at both end portions. This moving piece body is formed integrated into one body, and a permanent magnet is arranged in a manner such that the magnet surrounds the connection body of the moving piece body. The length of the connection body in the radial direction, which is perpendicular to the sliding direction of the moving piece, is less than that of the temporary magnet.

According to the fluid drive unit of the twenty-fourth aspect, when only the permanent magnet is arranged so that it can cover the connecting portion of the moving piece, the constitution of the moving piece of the eighteenth aspect can be realized. In this case, since the permanent magnet is positioned by the connection body, assembly is easy, i.e. the permanent magnet can be accurately positioned at a predetermined position. In other words, when the moving piece is composed as shown in the twenty-fourth aspect, ease of assembly of the moving piece can be enhanced.

In this fluid drive unit, when the permanent magnet is accommodated in a space formed between the face connecting the side faces of the temporary magnets at both end portions and the side face of the connecting body, the moving piece can be composed so that the permanent magnet cannot contact the inner wall of the moving piece accommodating portion. Therefore, according to the fluid drive unit of the twenty-fourth aspect, the dimensional tolerance of the permanent magnet can be increased. Further, it is possible to provide a fluid drive unit the performance of which is high, at a low manufacturing cost.

The moving piece of the fluid drive unit shown in the eighteenth to the twenty-second aspects may be composed as shown in the twenty-fifth aspect. The moving piece of the fluid drive unit of the twenty-fifth aspect is composed in a manner such that the temporary magnets are pivotally arranged at both end portions of the permanent magnet. According to the fluid drive unit composed as described above, the moving piece can be reciprocated smoothly along the inner wall of the moving piece accommodating portion. Further, it is possible to increase the dimensional tolerance of the permanent magnet.

The fluid drive units of the first to the eighth and the sixteenth to the twenty-fifth aspects may be composed as shown in the twenty-sixth aspect. The fluid drive unit of the twenty-sixth aspect includes: a passage connecting member engaged with an opening end of the moving piece accommodating portion so as to communicate the passage with the moving piece accommodating portion and connect an end portion of the passage with the moving piece accommodating portion; and an elastic sealing member inserted into the engaging portion of the passage connecting member with the moving piece accommodating portion. In this fluid drive unit, the passage connecting member is fixed to the moving piece accommodating portion by the elastic force of the elastic sealing member.

According to the fluid drive unit of the twenty-sixth aspect composed as described above, the passage connecting member is fixed to the moving piece accommodating portion by the elastic force of the elastic sealing member. Therefore, it is possible to prevent the fluid from flowing out from the engaging portion of the passage connecting member with the moving piece accommodating portion. Further, even when the passage connecting member is subjected to an external force, the external force is absorbed by the elastic sealing member, so that the external force cannot affect the moving piece accommodating portion.

Therefore, according to the present invention, it is possible to enhance the durability of the moving piece accommodating portion. In particular, when the moving piece accommodating portion is composed of a thin material such as a thin pipe, the moving piece accommodating portion is liable to break. Therefore, when the present invention (the twenty-sixth aspect) is applied to the fluid drive unit having the above a moving piece accommodating portion, the above effect can be further increased.

The fluid drive unit of the twenty-sixth aspect may be composed as shown in the twenty-seventh aspect. In the twenty-seventh aspect, the exciting coil is fixed by the passage connecting member so that a gap is formed between the exciting coil and the side of the moving piece accommodating portion.

In the fluid drive unit of the twenty-seventh aspect composed as described above, since the exciting coil does not contact the side of the moving piece accommodating portion, heat generated from the exciting coil is seldom diffused to the moving piece accommodating portion. Therefore, according to the fluid drive unit of the twenty-seventh aspect, it is possible to maintain the performance of the heat transport system in the same manner as that of the eleventh aspect. Since the weight of the exciting coil does not act directly on the moving piece accommodating portion, the durability of the moving piece accommodating portion can be enhanced.

In the fluid drive units of the first to the eighth aspects and the sixteenth to the twenty-seventh aspects, a vibration sound suppressing member for suppressing the vibration sound generated by the reciprocating motion of the moving piece may be arranged in the moving piece accommodating portion. According to the fluid drive unit of a twenty-eighth aspect composed as described above, the vibration sound generated in the case of step-out of the moving piece can be suppressed. Specifically, members made of rubber or resin having a hole to communicate the passage with the moving piece accommodating portion may be engaged with both end portions of the moving piece accommodating portion in the moving piece sliding direction.

In the fluid drive units of the first to the eighth aspects and the sixteenth to the twenty-seventh aspects, a spring member for regulating the sliding range of the moving piece may be arranged in the moving piece accommodating portion. In this connection, the spring member may be composed in a manner such that the spring member does not contact the moving piece in the normal operation or the spring member is in contact with the moving piece at all times. When the sliding range of the moving piece is regulated by the spring member, of a twenty-ninth aspect, it is possible to prevent the moving piece from stepping out.

In the case of driving the moving piece by magnetic force, when the sliding member is arranged around the magnetic body, on which the magnetic force is acting, as shown in the sixth aspect, it is possible to drive the moving piece smoothly as described before. The same can be said in the case of the other fluid drive units.

In the fluid drive units of the third, eighth and ninth aspects, the sliding member may be composed as shown in the thirtieth aspect. The sliding member of the fluid drive unit of the thirtieth aspect is arranged at the periphery of the point of application of the force acting on the moving piece by the drive means. When the sliding member is arranged at the periphery of the point of application of the force, the moving piece can be driven smoothly. Therefore, the durability of the fluid drive unit can be enhanced. Further, in the same manner as that of the fluid drive unit of the sixth aspect, the amount of eccentricity can be reduced.

In the fluid drive unit of the first to the thirtieth aspects, a groove may be formed on the surface of the moving piece. Further, as shown in the thirty-first aspect, the groove may be formed in the direction from both end portions of the moving piece in the sliding direction toward the central portion. When the groove is formed from the central portion of the moving piece toward both end portions in the sliding direction, it is possible to prevent the moving piece from being locked by abrasion powder of the moving piece (sliding member) remaining on the periphery of the moving piece. Therefore, according to the present invention, it is possible to prevent deterioration of the performance of the fluid drive unit by abrasion of the moving piece. Accordingly, it is possible to provide a fluid drive unit of high performance, the durability of which is high.

To be more specific, the groove on the surface of the moving piece may be a spiral groove which turns round on the side of the moving piece in the sliding direction. According to the fluid drive unit of the thirty-second aspect composed as described above, since the groove is formed in a spiral shape, when the moving piece is reciprocated, it turns around the axis of the sliding direction. Therefore, according to this fluid drive unit, it is possible to positively prevent powder caused by abrasion from remaining on the periphery of the moving piece, i.e. it is possible to facilitate to prevent obstruction of motion of the moving piece by powder resulting from abrasion.

In the fluid drive unit of the present invention, as shown in the thirty-third aspect, it is preferable that the area of the cross-section of the moving piece accommodating portion perpendicular to the sliding direction of the moving piece be larger than the area of the cross-section of the passage. When the moving piece accommodating portion is composed as described above, the amplitude of the fluid in the passage can be made larger than that of the moving piece. As a result, when this fluid drive unit is used, the amount of heat to be transported can be enhanced.

The fluid drive unit is explained above. When the fluid drive unit of the present invention is used for the heat transport system, the performance of heat transport can be substantially enhanced.

The heat transport system of the thirty-fourth aspect includes a heat transport body. The heat transport body includes: a fluid drive unit of one of the first to the thirty-third aspects; and a passage communicating with the moving piece accommodating portion of the fluid drive unit, wherein heat supplied from an external heat source to the fluid is transported to a low temperature portion by exchanging heat with the fluid vibrating in the passage by the fluid drive unit.

According to this heat transport system, the fluid in the passage can be effectively vibrated by the fluid drive unit. Therefore, heat supplied to the fluid from an external heat source can be effectively transported to a low temperature portion. Accordingly, the performance of heat transport can be greatly enhanced.

When the heat transport body is composed as shown in the thirty-fifth aspect, the efficiency of heat transport can be further enhanced. The heat transport body in the heat transport system of the thirty-fifth aspect is composed so that the fluid can flow in the opposite direction in adjacent passages. When the fluid drive unit is operated, heat is exchanged with the fluid vibrating in the passage, so that heat of the fluid can be transported to the fluid in the adjacent passage. In this way, heat supplied to the fluid from an external heat source is transported to a low temperature portion. In this connection, the passages adjacent to each other may be composed of one passage which meanders. Alternatively, the passages adjacent to each other may be composed of a plurality of passages arranged parallel to each other.

According to the heat transport system of the thirty-fifth aspect composed as described above, since the fluid flows in the opposite directions in the adjacent passages, one of the wall faces of the heat transport body interposed between the adjacent passages is exposed to an element conveyed from the high temperature portion, and the other of the wall faces of the heat transport body interposed between the adjacent passages is exposed to an element conveyed from the low temperature portion as shown in FIG. 24. Accordingly, in the space, compared with a case in which the passages are not adjacent to each other, the temperature gradient becomes steep. As a result, heat can be moved efficiency between the fluids adjacent to each other, and the performance of heat transport can be enhanced. In this connection, it is a primary object that the fluid drive unit of the present invention be put into practical use for the heat transport system. However, it should be noted that the present invention is not limited to the above specific use.

The present invention may be more fully understood from the description of preferred aspects of the invention set forth below, together with the accompanying drawings.

BRIEF DESCRIPTION OF THE DRAWINGS

FIGS. 2A, 2B and 2C are sectional views showing the constitution of the heat transport device body 21.

FIGS. 12A, 12B and 12C are schematic illustrations showing the constitution of the piston 143 provided in the cylinder 141.

FIGS. 14A, 14b and 14C are graphs showing a characteristic of the thrust directed to the piston.

FIGS. 15A, 15B and 15C are schematic illustrations showing the constitution of the piston 180.

FIGS. 16A, 16B and 16C are schematic illustrations showing the constitution of the piston 190.

FIGS. 17A, 17B and 17C are schematic illustrations showing the constitution of the piston 190'.

FIGS. 18A and 18B are schematic illustrations showing the constitution of the piston 200.

FIGS. 19A and 19B are schematic illustrations showing the constitution of the piston 200'.

FIGS. 23A and 23B are schematic illustrations showing the use of the conventional pump device 80.

DESCRIPTION OF PREFERRED EMBODIMENTS

Figure 1:
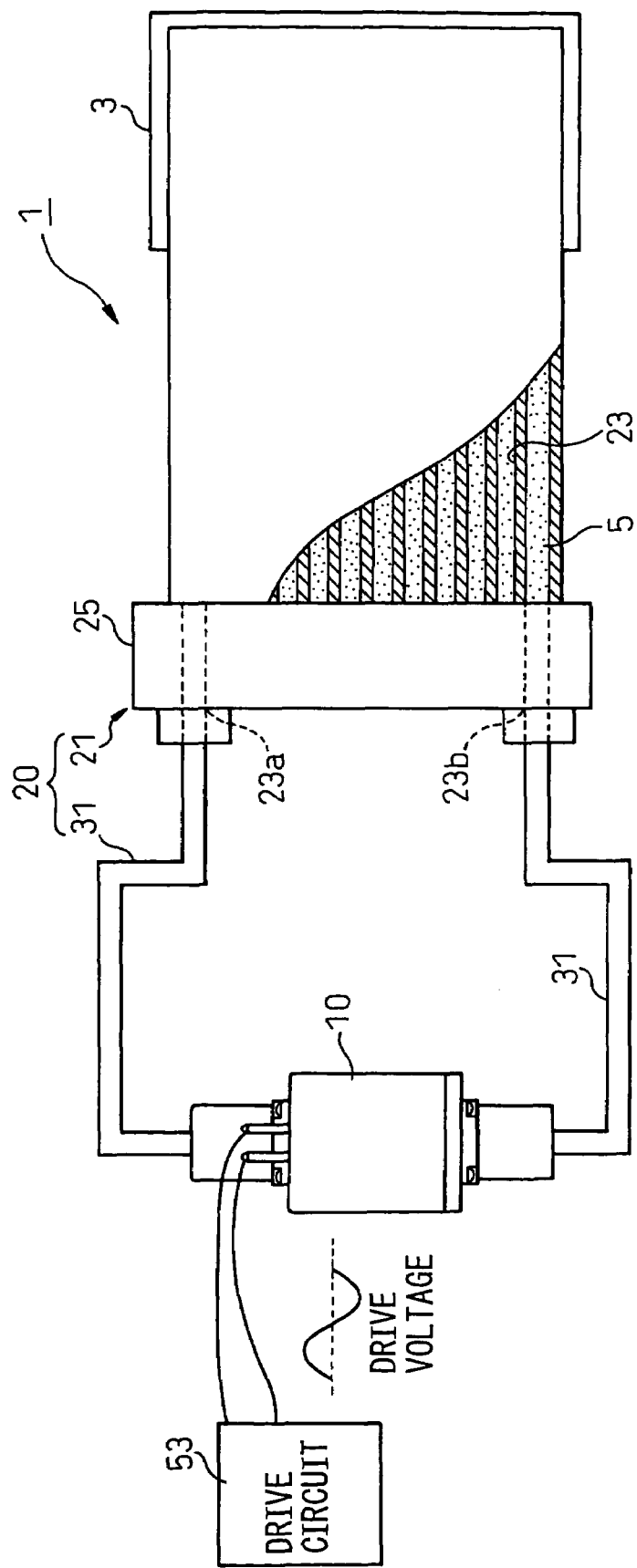
FIG. 1 is a schematic illustration showing the constitution of the heat transport system 1 of the first embodiment.

Referring to the drawings, embodiments of the present invention will now be explained. First of all, the first embodiment is explained. FIG. 1 is a schematic illustration showing the constitution of the heat transport system 1 of the first embodiment to which the present invention is applied.

The heat transport system 1 of this embodiment shown in FIG. 1 functions as a cooling system for cooling the heating body 3. This heat transport system 1 includes: a fluid drive unit 10 for vibrating the fluid 5 to which the present invention is applied; and a heat transport device 20 having a passage 23 connected to the fluid drive unit 10.

The heat transport device 20 includes: a heat transport device body 21; and a pair of connection pipes 31 for connecting both end portions 23a, 23b of the passage 23, which is formed in the heat transport device body 21, to the fluid drive unit 10. The heat transport device body 21 is a plate-shaped body composed of the passage 23, the profile of which meanders, charged with the fluid 5. The radiating portion 25 is provided at one end portion of the heat transport device body 21 in the longitudinal direction. The radiating portion 25 cools the fluid 5 charged in the passage 23. On the other hand, at the other end of the heat transport device body 21, the heating body 3 to be cooled, which is an electronic part such as a microprocessor used for an electronic computer, is arranged.

This heat transport body 21 is a laminated body composed of metallic plates made of copper or aluminum, the heat conductivity of which is high. On each metallic plate, a groove functioning as the meandering passage is formed by means of etching. When these metallic plates are laminated on each other, the passage 23 composed of multiple layers is formed in the heat transport device body 21. In this connection, the metallic plates are laminated on each other in the thickness direction and joined to each other by means of soldering or thermo-compression bonding.

Figure 3:
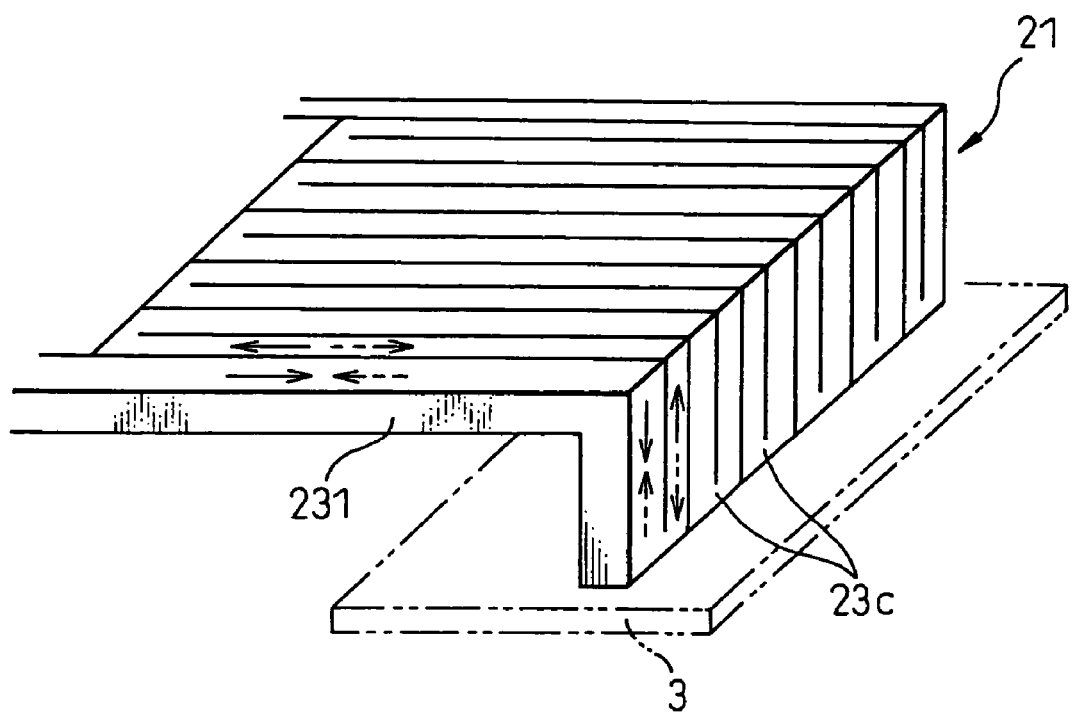
FIG. 3 is a perspective view showing the constitution of the uppermost passage 231 in the heat transport device body 21.

Specifically, as shown in FIG. 2A, the passage 23 formed in the heat transport device body 21 is composed of four layers of passages 231, 233, 235, 237. In this connection, FIG. 2A is a sectional view showing a cross-section of the heat transport device body 21 in the thickness direction. FIG. 2B is a sectional view taken on line A-A' of the heat transport device body 21, and FIG. 2C is a sectional view taken on line B-B' of the heat transport device body 21. FIG. 3 is a perspective view of the uppermost passage 231 of the heat transport device body 21.

As shown in FIGS. 2B and 2C, the passage 23 on each layer is composed of one meandering passage, and the moving direction of the fluid 5 in one passage 23 is opposite to the moving direction of the fluid 5 in the other passage 23, which is located adjacent to the one passage 23. In particular, the passage 23 in an upper portion of the heating body 3 to be cooled is directed to the bottom portion 21a of the heat transport device body 21.

In this embodiment, the passage 23 extending from the radiating portion 25 side to the heating body 3 side parallel with the bottom face of the heat transport body 21 is directed to the bottom portion 21a of the heat transport device body 21 at the end portion of the heat transport device body 21 in which the heating body 3 to be cooled is arranged, and the passage adjacent to the heating body 3 is arranged perpendicular to the plate-shaped heating body 3, and the turning portion 23c of the meandering passage is arranged in a portion facing the heating body 3. Due to the above constitution, in this embodiment, the fluid 5 in the passage 5, which is located close to the heating body 3, can be displaced being vibrated as if the fluid 5 had collided with the heating body 3.

Figure 4:
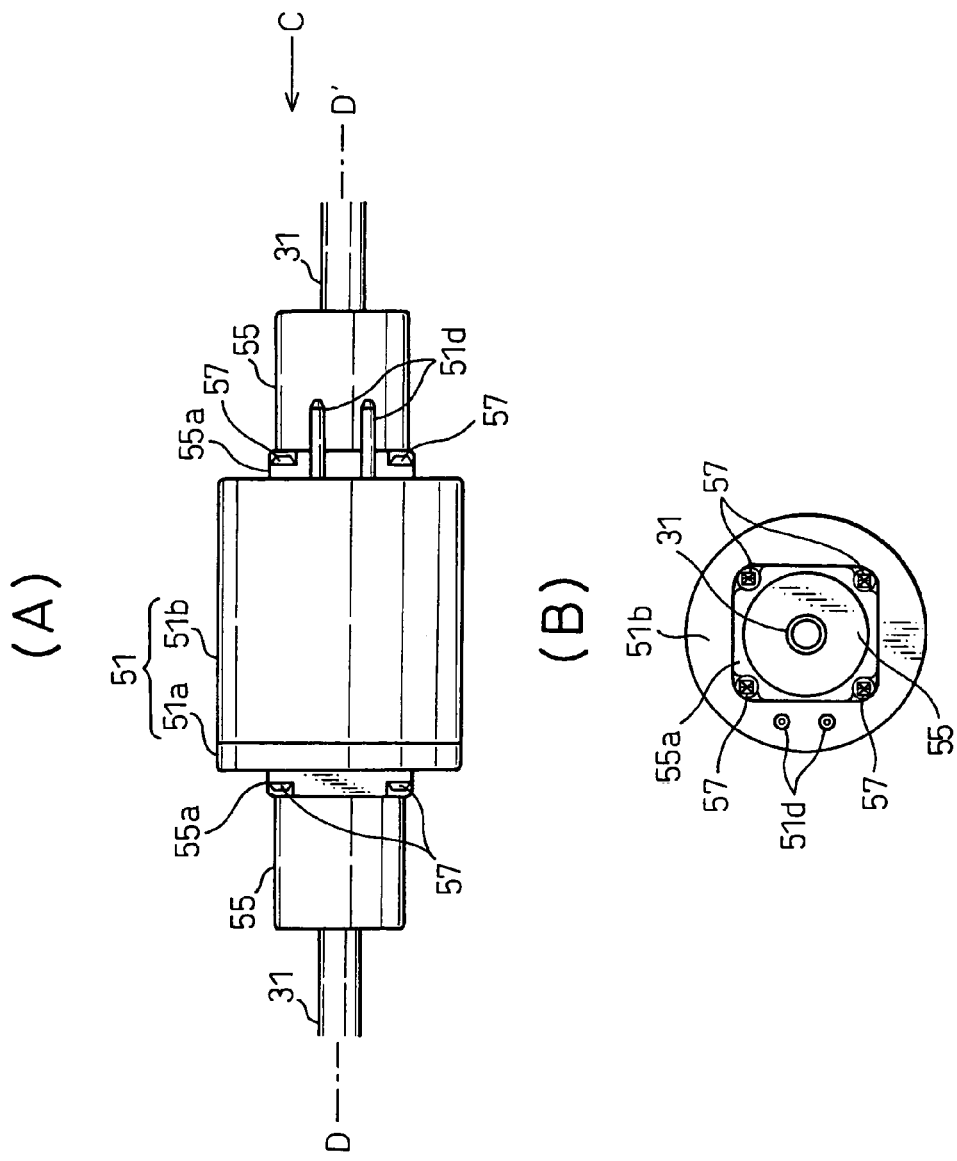
FIGS. 4A and 4B are views showing an appearance of the fluid drive unit 10.
Figure 5:
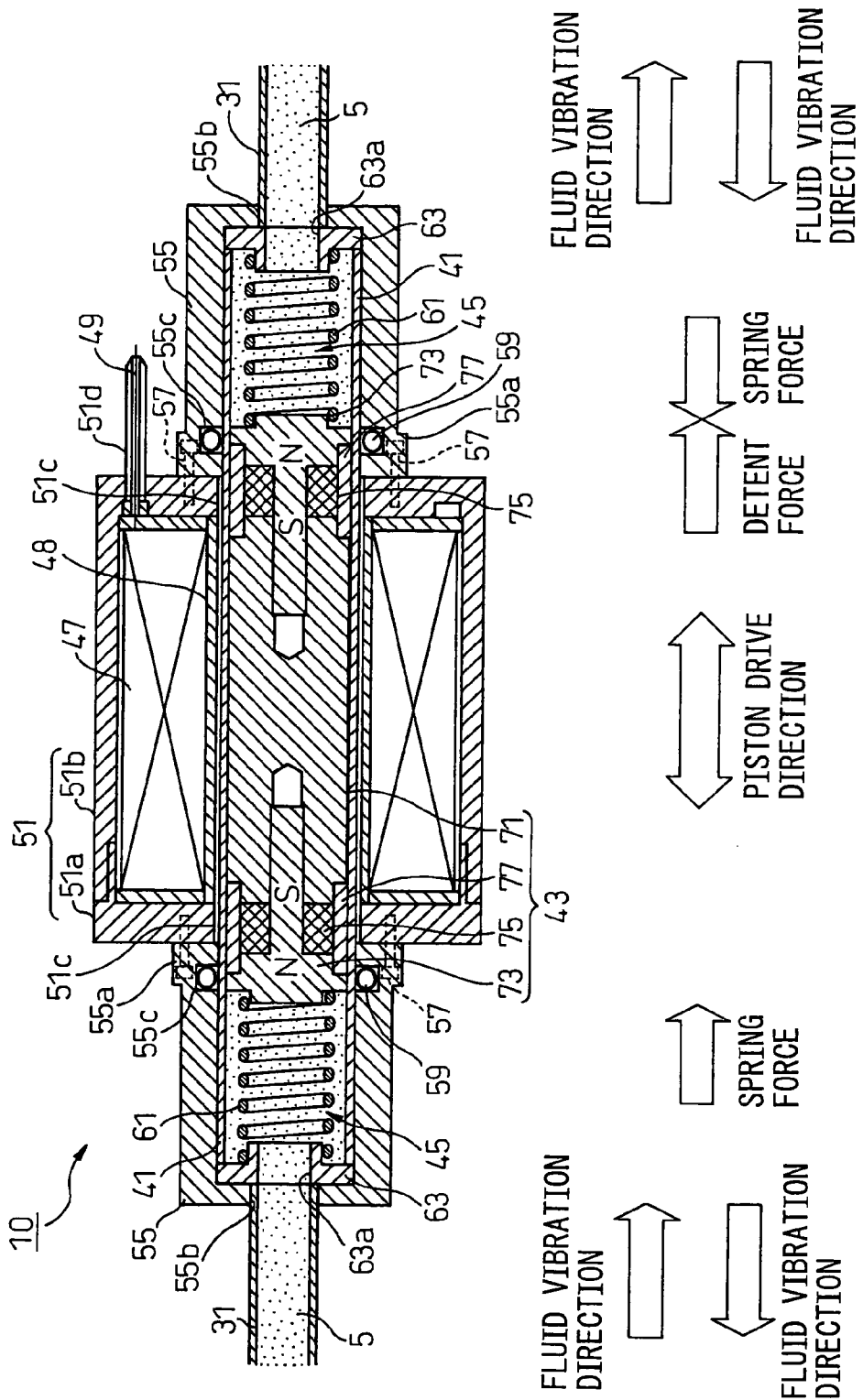
FIG. 5 is a sectional view taken on line D-D' of the fluid drive unit 10.
Figure 6:
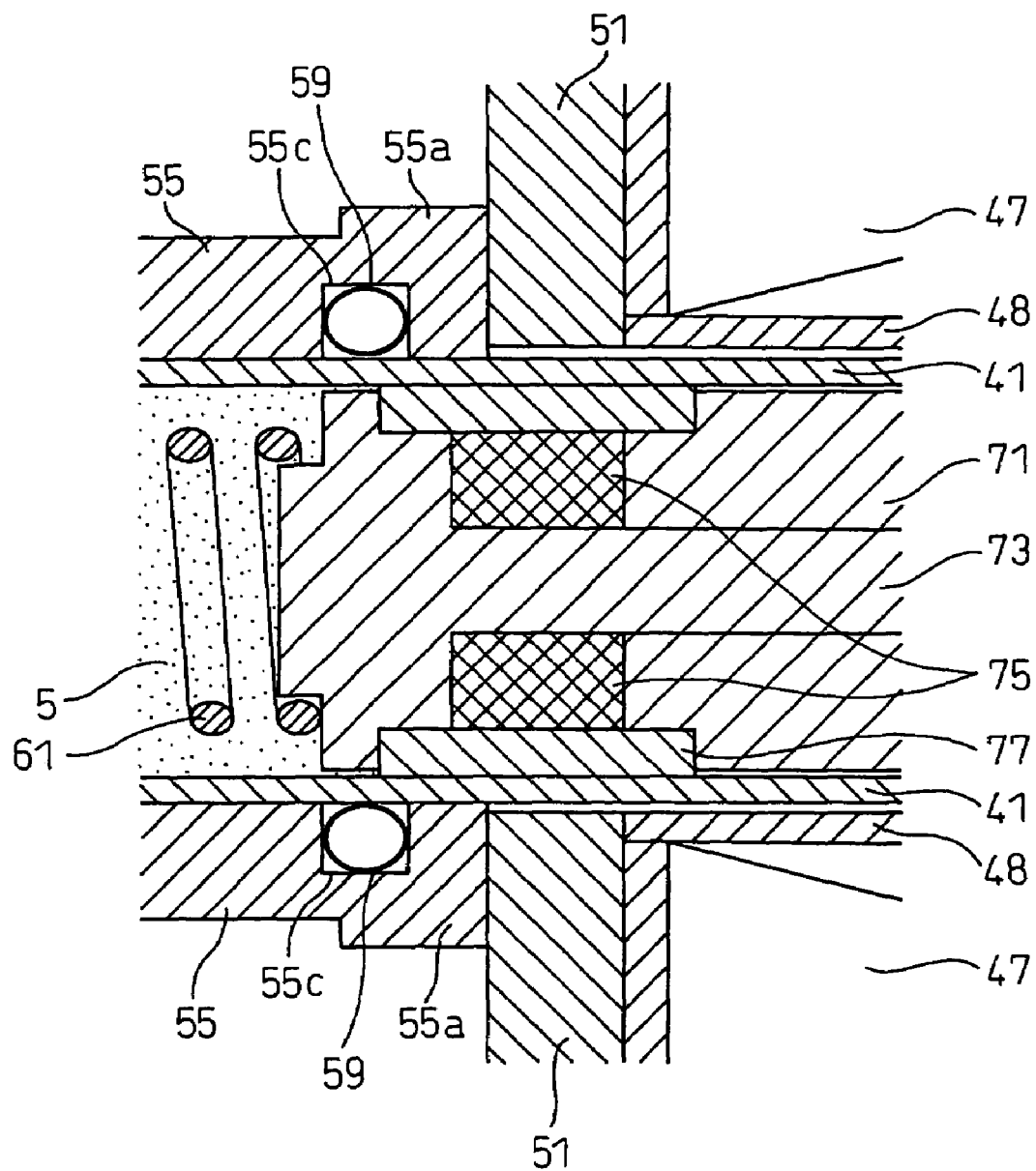
FIG. 6 is an enlarged sectional view showing the fluid drive unit 10 in which a portion of the section taken on line D-D' is enlarged.

On the other hand, the fluid drive unit 10 for vibrating the fluid 5 is connected to a pair of connection pipes 31 connected to the end portion of the passage on each layer. FIGS. 4A and 4B are views showing the appearance of the fluid drive unit 10 of the present embodiment. FIG. 4A is a schematic illustration showing the constitution of the side portion of the fluid drive unit 10, and FIG. 4B is a schematic illustration showing the constitution of the end portion of the fluid drive unit 10, wherein the view is taken in the direction of arrow C. FIG. 5 is a sectional view taken on line D-D' of the fluid drive unit 10. FIG. 6 is an enlarged sectional view showing the fluid drive unit 10 in which a portion of the section D-D' is enlarged.

As shown in FIG. 5, the fluid drive unit 10 of the present embodiment includes a cylinder 41 communicating with both end portions 23a, 23b of the passages 231, 233, 235, 237 on the aforementioned layers of the heat transport device body 21 via the connection pipe 31. Specifically, a pair of connection pipes 31 are connected to the fluid drive unit 10 communicating with the end portions of the cylinder 41. This cylinder 41 is provided with a single piston 43 capable of sliding in the axial direction of the cylinder. The cross-sectional area of the cylinder 41 perpendicular to the sliding direction of the piston 43 is larger than the cross-sectional area of the connection pipe 31 and that of the passage 23 of the heat transport device 21.

On the other hand, the piston 43 is shorter than the cylinder 41. In the cylinder 41, the fluid 5 flows from the connection pipe 31 into the spaces 45 which are interposed between both end portions of the piston in the sliding direction and the end portions of the connecting pipes 31.

Around the side of the cylinder 41 in the axial direction, the hollow solenoid coil 47 used for exciting is arranged which surrounds the side of the cylinder 41 at the central portion of the cylinder. In the solenoid coil 47, the lead wire 49 is wound around the coil bobbin 48. The inner diameter of the coil bobbin 48 is slightly larger than the outer diameter of the cylinder 41. The solenoid coil 47 is fixed to the yoke 51 for forming a magnetic path, which surrounds the outer circumference of the solenoid coil 47, so that the coil bobbin 48 cannot come into contact with the side of the cylinder 41.

The yoke 51 is composed of a pair of yoke composing bodies 51a, 51b. Each of the yoke composing bodies 51a, 51b is a body having a bottom portion, one end of which is open. At the center of the bottom portion of the yoke composing member, the hole 51c, into which the cylinder 41 is inserted, is formed. The holes 51c of the yoke composing bodies 51a, 51b are slightly larger than the outer diameter of the cylinder 41.

The yoke 51 is composed in a manner such that the opening end portions of the pair of yoke composing bodies 51a, 51b are connected to each other. Under the above condition, the yoke 51 covers the entire circumference of the solenoid coil 47 and engages with the coil bobbin 48, so that the solenoid coil 47 can be fixed inside the yoke 51. In this connection, in the yoke composing member 51b, two drawing portions 51d for drawing out both end portions of the lead wire 49 composing the solenoid coil 47 are provided. The solenoid coil 47 is electrically connected to the drive circuit 53 for impressing AC voltage upon the solenoid coil 47 so that the solenoid coil 47 can be excited. The yoke 51 is not contacted with the side of the cylinder 41, but is screwed onto a pair of cylinder caps 55 engaged with both end portions of the cylinder 41.

The cylinder cap 55 is a body, one end of which is open, having a bottom portion at the other end. The flange 55a is provided at the opening end portion of the cylinder cap 55. The inner diameter of the cylinder cap 55 is substantially the same as the outer diameter of the cylinder 41. At the center of the cylinder cap 55, a hole 55b is formed, into which the connection pipe 31 is inserted. The pair of cylinder caps 55 are respectively engaged with the end portion of the cylinder 41 from the opening end side and fixed to the yoke 51 by the screw 57 attached to the flange portion 55a.

The cylinder cap 55 is engaged with the end portion of the cylinder 41 and fixed to the end portion thereof, so that the yoke 51 can be fixed on the periphery of the side of the cylinder 41 under the condition wherein the yoke 51 does not contact the cylinder 41. Accordingly, the solenoid coil 47 fixed to the yoke 51 is arranged on the periphery of the side of the cylinder under the condition wherein a gap is formed between the side of the cylinder 41 and the solenoid coil 47; i.e. under the condition wherein the solenoid coil 47 does not contact the cylinder 41.

In this connection, the ring-shaped groove 55c for accommodating O-ring 59 is formed on the inner wall of the cylinder cap 55. The O-ring 59 is used for preventing fluid 5 which leaks out from both end portions of the cylinder 41, from entering the solenoid coil side.

In the spaces 45 provided on both sides of the piston 43 in the cylinder 41, a pair of coil springs 61 and spring engaging members 63 are accommodated before the cylinder caps 55 are attached. In this connection, the spring engaging member 63 is used for fixing the coil spring 61 in the cylinder 41 under the condition wherein a spring force is exerted by the coil spring 61.

The coil spring 61 is used for slidably arranging the piston 43 at the center of the cylinder 41. Specifically, the coil spring 61 is used so that the center of the solenoid coil 47 and the center of the piston 43 coincide with each other. The coil spring 61 is interposed between the spring engaging member 63, which is fixed to the bottom portion of the cylinder cap 55, and the end portion of the piston 43. The coil spring 61 imparts a pushing force to the end portion of the piston 43 in the direction of the center of the piston 43. In this connection, the spring engaging member 63 is a disk-shaped body, the diameter of which is the same as the inner diameter of the cylinder 41. At the center of the spring engaging member 63, the hole 63a, the diameter of which is substantially the same as the outer diameter of the connection pipe 31, is formed at the center of the spring engaging member 63.

Figure 7:
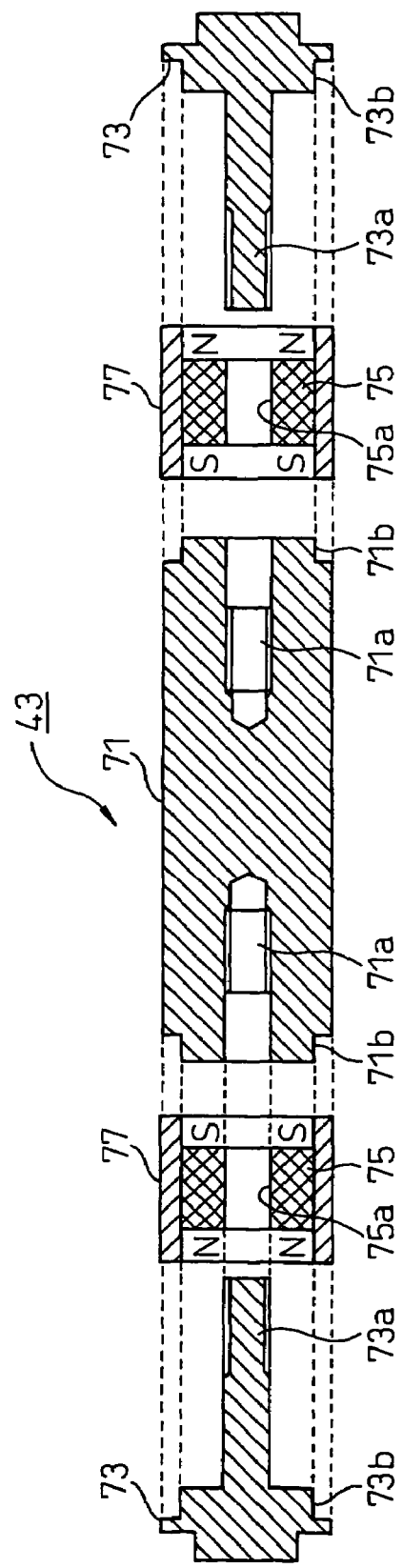
FIG. 7 is a development view of the piston 43 in which members composing the piston 43 are shown being developed.

Next, the constitution of the piston 43 will be explained below. In this connection, FIG. 7 is a development view in which members composing the piston 43 are shown being developed. The piston 43 used for the fluid drive unit 10 of this embodiment includes: a piston central portion composing member 71 for composing the central portion of the piston 43; a pair of piston end portion composing bodies 73 for composing the end portions of the piston 43; and a pair of permanent magnets 75 and sliding members, which are made of Teflon (trademark), interposed between the piston central portion composing member 71 and the piston end portion composing body 73. In this connection, the sliding member may be made of carbon or nickel plated material (nickel phosphorus plated material).

The permanent magnet 75 is a columnar body having a hole 75a in the axial direction. The permanent magnet 75 has the magnetic poles (N-pole/S-pole) at both end portions in the axial direction. The outer diameter of the permanent magnet 75 is smaller than the diameter of the piston 43.

On the other hand, the piston end portion composing body 73 has a screw portion 73a which is inserted into the hole 75a of the permanent magnet 75 and screwed into the screw hole 71a provided at both end portions of the piston central portion composing member 71. In the end portion of the piston end portion composing body 73 on the piston central portion composing member 71 side, the small diameter portion 73b to be engaged with the sliding member 77 (specifically, the sliding bearing member) is formed. In this connection, in the same manner as that of the permanent magnet 75, the diameter of the small diameter portion 73b is smaller than the diameter of the piston 43. In addition, the small diameter portion 71b to be engaged with the sliding member 77 is provided at both end portions of the piston central portion composing member 71.

The piston end portion composing body 73, the piston central portion composing member 71, the permanent magnet 75 and the sliding member 77 are assembled as follows. The permanent magnet 75 is inserted into the screw portion 73a of the piston end portion composing body 73. Further, under the condition wherein the sliding member 77 is engaged with the small diameter portion 73b, the screw portion 73a is screwed into the screw hole 71a of the piston central portion composing member 71. In this way, the above components are connected with each other so that the piston 43 can be composed.

The thus-composed piston 43 has a pair of sliding members 77 which are arranged symmetrically on both sides of the center of the piston 43 in the sliding direction, and the permanent magnet 75 is provided inside the sliding member 77 arranged on the side of the piston 43. The sliding face of the piston 43 coming into contact with the inner wall of the cylinder 41 is composed of a sliding member 77. A pair of the permanent magnets 75 are arranged symmetrically with respect to the center of the piston 43 so that the same type magnetic poles (S-pole) can be opposed to each other.

The constitution of the heat transport device 20 of the fluid drive unit 10 is explained above. Operation of the heat transport device 20 of the fluid drive unit 10 will now be explained below.

As described above, since AC voltage is impressed upon the solenoid coil 47, the magnetic poles of N-pole and S-pole are in turn periodically generated by the drive circuit 53 on the inner face (the face of the yoke 51 opposed to the cylinder 41) of the hole 51c of the yoke 51 which surrounds the solenoid coil 47. At this time, N-pole is formed in the hole 51c of the yoke 51 located on one end side of the solenoid coil 47, and S-pole opposite to N-pole is formed in the hole 51c of the yoke 51 located on the other end side of the solenoid coil 47.

Accordingly, inside the cylinder 41, a magnetic flux is generated in the sliding direction (the axial direction of the cylinder) of the piston 43. A repulsing force in the direction of the cylinder end portion is directed to the piston 43 by N-pole of the yoke 51, and an attracting force in direction of the cylinder center is directed to the piston 43 by S-pole of the yoke 51 arranged on the opposite side. Due to the foregoing, the piston 43 slides from S-pole side to N-pole side of the yoke 51. The piston 43 repeats this operation according to the inverting period of the magnetic poles.

The drive circuit 53 impresses AC voltage of the period corresponding to the vibration period of the piston 43 to be realized, upon the solenoid coil 47. Due to the foregoing, the piston 43 is reciprocated at the center of the solenoid coil 47 in the axial direction of the cylinder 41.

In this connection, even when the solenoid coil 47 is not energized, the piston 43 is subjected to a detent force by which the piston 43 is moved in the axial direction to the outside of the solenoid coil 47, so that the piston 43 is moved to a magnetically stable position. However, in this embodiment, the pushing force of the above coil spring 61 is directed to the piston 43 so that the detent force can be canceled. Therefore, the piston 43 can be stably positioned at the center of the solenoid coil 47 when the solenoid coil 47 is not energized.

When the piston 43 is reciprocated, the fluid 5, the volume of which corresponds to the distance of movement of the piston 43, is discharged from one end portion of the cylinder 41. The thus discharged fluid 5 flows into one end of the passage 23 of the heat transport device body 21, and the same volume of fluid 5 is discharged from the other end of the passage 23. By this principle, the fluid 5 charged in the heat transport device is vibrated in the direction of the arrow shown in FIG. 2 according to the reciprocating motion of the piston 43. In this connection, the arrow x shown in FIG. 2 indicates the direction of movement of the fluid 5 when the piston 43 is moved into the passage end portion 23a, and the arrow y shown in FIG. 2 indicates the direction of movement of the fluid 5 when the piston 43 is moved into the passage end portion 23b.

Figure 10:
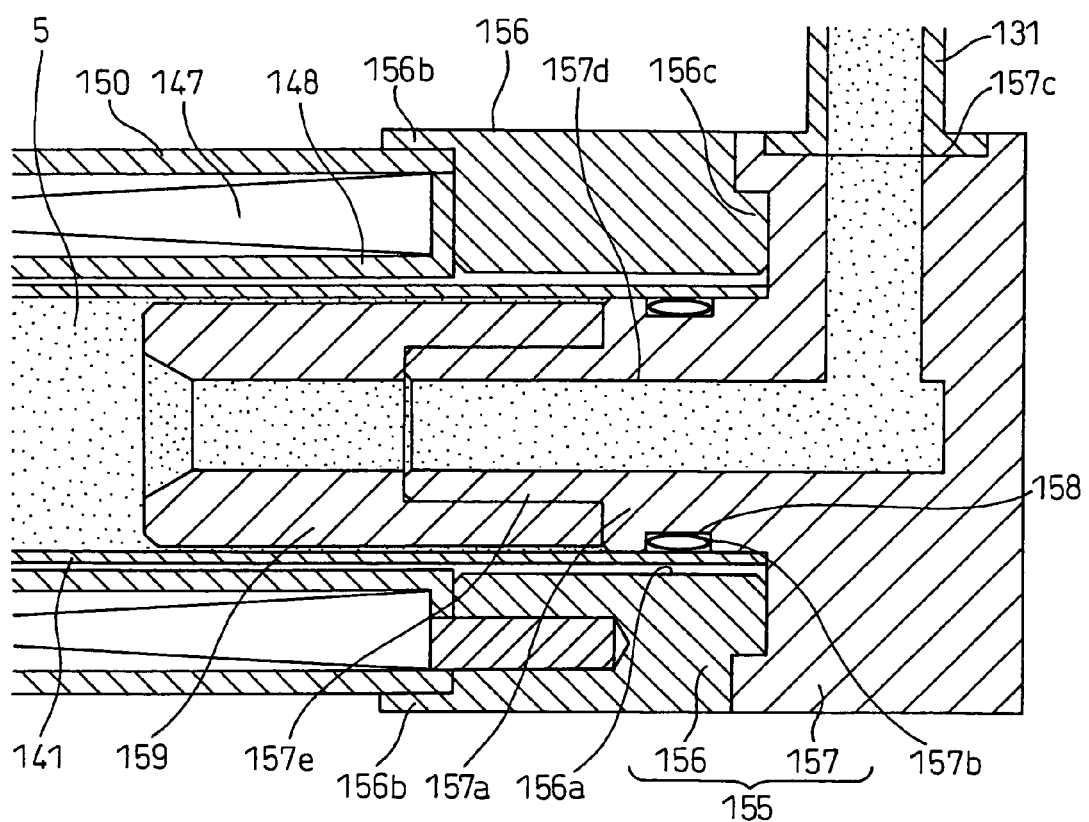
FIG. 10 is an enlarged sectional view showing an end portion of the fluid drive unit 110.

According to this operation of the fluid drive unit 10, the heat transport device 21 conducts heat exchange with the fluid 5 vibrated in the passage 23 in the heat transport device 21, and the heat supplied from the heating body 3 to the fluid 5 is quickly transported to the radiating portion 25, which is a low temperature portion, by the aforementioned principle shown in FIG. 10.

In the heat transport device body 21, the partitioning portion 22 for partitioning the passages 23, which are adjacent to each other, is periodically interposed between the fluid 5 of high temperature and the fluid 5 of low temperature, i.e. the fluid 5 of high temperature and the fluid 5 of low temperature are periodically opposed to each other. Therefore, heat of the fluid 5 of high temperature is transported to the fluid 5 of low temperature in the adjoining passage. This heat is moved by vibration as if the heat played "leapfrog". In this way, the heat of the heating body 3 is moved to the radiating portion 25, which is a low temperature portion, while the heat is being conducted in the upper direction of the heat transport device body 21.

At this time, the fluid 5 located close to the heating body 3 is vibrated and displaced as if the fluid 5 collided with the heating body 3. Therefore, the fluid 5 is vibrated in a turbulent flow state in a portion of the passage 23 corresponding to the heating body 3. Accordingly, in the portion corresponding to the heating body 3, the fluid 5 of low temperature intermittently collides with the heating body 3, so that the heat transfer coefficient between the heating body 3 and the fluid 5 is increased. Accordingly, compared with a case in which no turbulent flow is caused, a large quantity of heat can be recovered from the heating body 3 in this embodiment. Therefore, it is possible to transport heat quickly.

Explanations above relate to the heat transport system 1 and the fluid drive unit 10 of the present embodiment. In the fluid drive unit 10 of the present embodiment, by the reciprocating motion of the piston 43 in the cylinder 41 communicating with both end portions 23a, 23b of the passage 23 composed in the heat transport device body 21, the fluid 5 charged in the passage 23 can be accurately vibrated in the passage direction (the directions of the arrows x and y in FIG. 2). At this time, since the volume of the region in which the fluid 5 is present does not change, no cavitation (bubbles) occurs in the fluid 23. Accordingly, when this fluid drive unit 10 is adopted, it is possible to avoid the occurrence of vibration and noise caused by cavitation.

In the heat transport system 1 of the present embodiment, since the single piston 43 can be driven by the single solenoid coil 47 so as to vibrate the fluid 5, it is not necessary to carry out synchronizing of the drive means, which is required when a plurality of pump devices 80 shown in FIG. 23B are used. Therefore, the piston 43 can be controlled with ease. Consequently, when the present embodiment is adopted, the fluid drive unit 10 preferably used for the heat transport system can be manufactured at low cost. Accordingly, the heat transport system can be built at low cost.

According to the fluid drive unit 10 of the present embodiment, since the solenoid coil 47 is arranged outside the cylinder 41 and the piston 43 is reciprocated by magnetic force, when only O-ring 59 is arranged in the periphery of the solenoid coil 47 so as to prevent the fluid 5 from flowing out from the end portion of the cylinder 41, short circuiting of the electronic circuit can be prevented. Further, since it is simple to air-tightly seal the cylinder 41, the fluid 5 can be easily prevented from leaking outside.

In this embodiment, the permanent magnets 75 are arranged so that magnetic poles of the same type (S-pole) are opposed to each other, and an attraction force acts on one side of the piston 43, while a repulsing force acts on the other side thereof. Therefore, the piston 43 can be given a high intensity of thrust. Accordingly, the piston 43 can be reciprocated efficiently by a low level of electric power.

In this embodiment, the sliding members 77 are arranged at symmetrical positions (both end portions) on both sides of the piston 43 in the axial direction, and form the sliding faces of the piston 43 coming into contact with the inner wall of the cylinder 41. Therefore, the piston 43 can be driven smoothly and thus the durability of the device can be enhanced. Further, it is not necessary to provide a bearing member on the inner wall of the cylinder 41. Accordingly, the number of parts can be decreased, and the manufacturing cost of the device can be reduced.

In this embodiment, the sliding members 77 are arranged at symmetrical positions (both end portions) on both sides of the piston 43 in the axial direction, and a pair of sliding members 77 are arranged on the peripheries of the permanent magnets 75 in which the thrust (magnetic force) of the piston 43 is activated by the magnetic field generated by the solenoid coil 47, and the sliding faces are formed at these positions. Therefore, the amount of eccentricity can be significantly reduced. Due to the foregoing, according to the fluid drive unit 10 of this embodiment, the piston 43 can be appropriately reciprocated in the axial direction of the cylinder, and the durability of the device can be enhanced.

In this embodiment, a method is adopted in which the parts composing the piston 43 are connected to each other in the axial direction by means of screws. Therefore, the piston 43 can be easily assembled and the manufacturing cost of the fluid drive unit 10 can be reduced.

In the present embodiment, a gap is formed between the inner face of the hole 51c of the yoke 51, which is in the neighborhood of the magnetic pole of the electromagnet composed of the yoke 51 and the solenoid coil 47, and the side of the cylinder 41, so that the yoke 51 and the cylinder 41 can not be contacted with each other. Accordingly, it is possible to prevent bending stress from acting on the cylinder 41 while the inner face of the hole 51c of the yoke 51 is being used as a fulcrum. In particular, in the present embodiment, since the cylinder cap 55 holds the yoke 51, it is possible to prevent a high intensity of bending stress from acting on the cylinder 41 due to the weight of the yoke 51. As a result, the durability of the fluid drive unit 10 can be significantly enhanced.

In the present embodiment, the coil bobbin 48 of the solenoid coil 47 does not contact the cylinder 41, and a gap is formed between the coil bobbin 48 and the cylinder 41. Therefore, it is possible to prevent the heat, which is generated from the solenoid coil 47, from diffusing to the cylinder 41. Accordingly, it is possible to prevent the cooling performance of the heat generating body 3, the heat generating source of which is the solenoid coil 47, from deteriorating.

In the present embodiment, the cross-sectional area of the cylinder 41 is larger than that of the passage 23. Therefore, the amplitude of the fluid 5 in the passage 23 can be made larger than that of the piston 43. As a result, the performance of heat transport in the heat transport system 1 can be significantly enhanced.

The yoke connecting member described in the present invention corresponds to the cylinder cap 55 of this embodiment, and the heat transport body described in the present invention corresponds to the heat transport device 20 of this embodiment. The drive means includes: an electromagnet composed of the solenoid coil 47 and the yoke 51; and a drive circuit 53 for driving the electromagnet.

Figure 8:
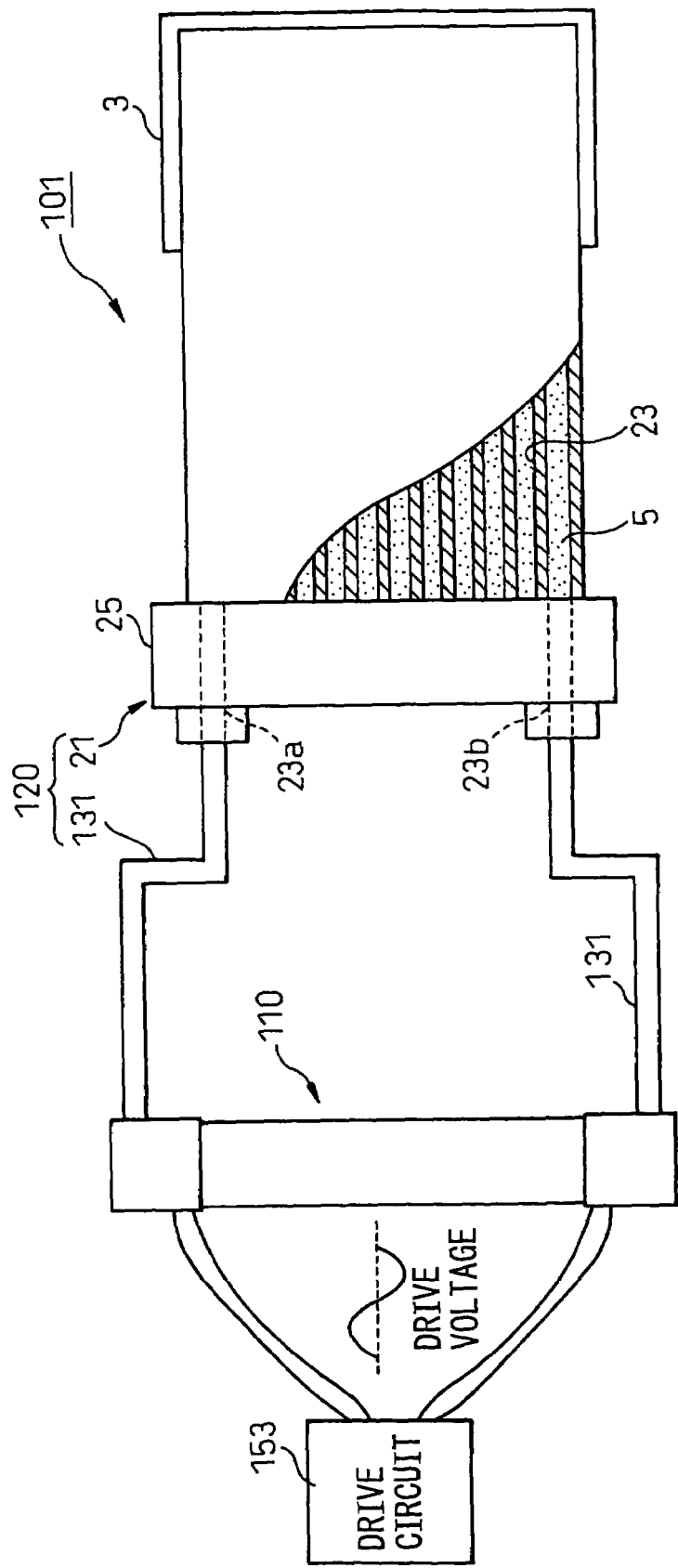
FIG. 8 is a schematic illustration showing the constitution of the heat transport system 101 of the second embodiment.

Next, the second embodiment will be explained below. FIG. 8 is a schematic illustration showing the constitution of the heat transport system 101 of the second embodiment. The heat transport system 101 of the second embodiment includes: a fluid drive unit 110; and a heat transport device 120 having the passage 23 connected to the fluid drive unit 110.

The heat transport device 120 includes: a heat transport device body 21 (shown in FIG. 2), the constitution of which is the same as that of the first embodiment; and a pair of connection pipes 131 for connecting both end portions 23a, 23b of the passage 23, which is formed in the heat transport device body 21, to the fluid drive unit 110. At the end portion of the heat transport device body 21 on the opposite side to the radiating portion 25, the heating body 3, which is an object to be cooled, is arranged in the same manner as that of the first embodiment.

Figure 9:
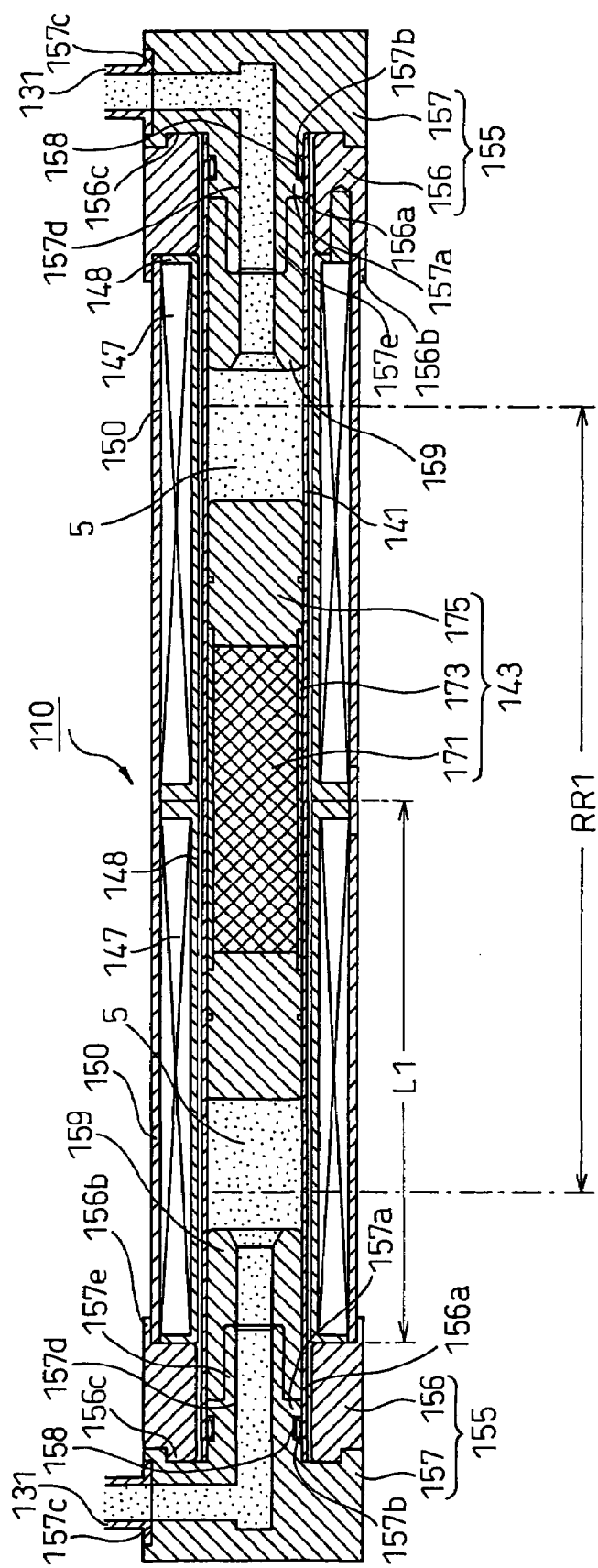
FIG. 9 is a sectional view showing an outline of the constitution of the section in the longitudinal direction of the fluid drive unit 110 of the second embodiment.
Figure 11:
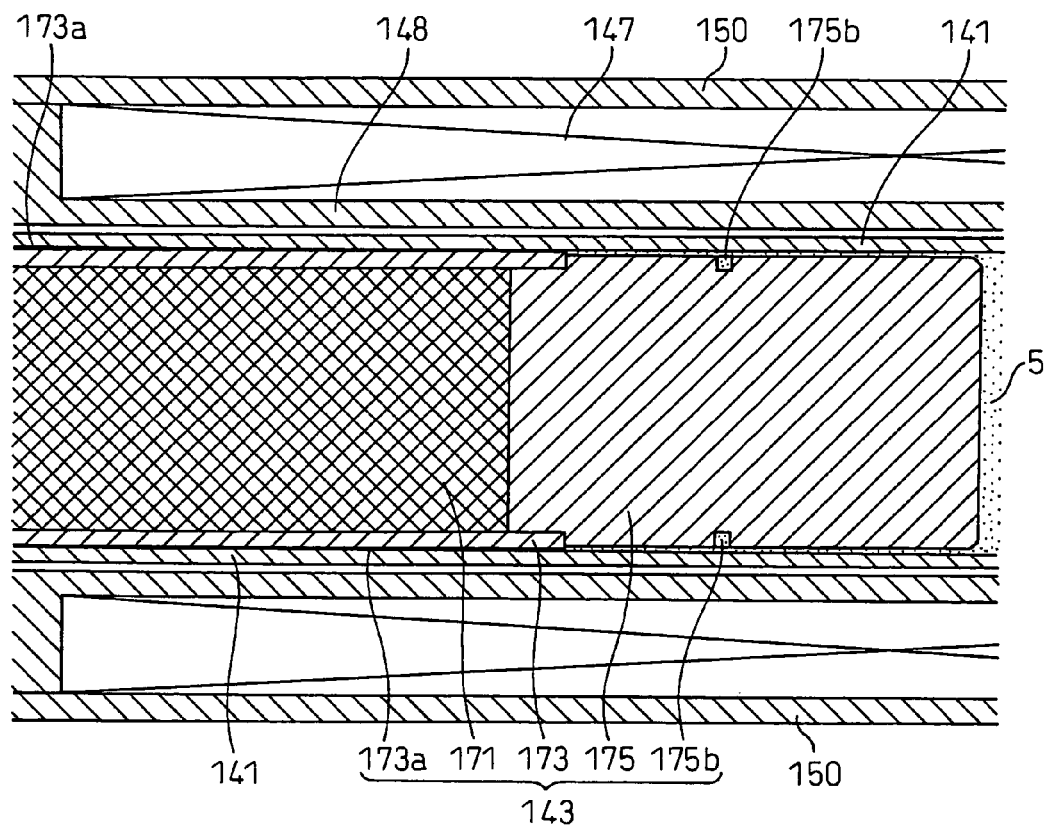
FIG. 11 is an enlarged sectional view showing a right central portion of the fluid drive unit 110.

The fluid drive unit 110 is connected to the pair of connection pipes 131 connected to the passage end portions of the layers of the heat transport device body 21. FIG. 9 is a sectional view showing an outline of the constitution of the section in the longitudinal direction of the fluid drive unit 110 of the second embodiment, FIG. 10 is an enlarged sectional view showing an end portion of the fluid drive unit 110, and FIG. 11 is an enlarged sectional view showing a right central portion of the fluid drive unit 110.

As shown in FIG. 9, the fluid drive unit 110 includes a cylinder 141 communicating with both end portions 23a, 23b of the passages 231, 233, 235, 237 on the aforementioned layers of the heat transport device body 21 via the connection pipe 131. The cylinder 141 is provided with a piston 143 capable of sliding in the axial direction of the cylinder.

The piston 143 is shorter than the cylinder 141. The cross-sectional area of the cylinder 141 perpendicular to the sliding direction of the piston 143 (i.e. the axial direction of the cylinder 141) is larger than the cross-sectional area of the connecting pipe 131 and that of the passage 23 of the heat transport device body 21. In the cylinder 141 for accommodating the piston 143 composed as described above, the fluid 5 flowing from the connecting pipe 131 is charged into the spaces interposed between both end portions of the piston 143 in the sliding direction and the end portions of the connecting pipes communicating with the cylinder 141.

On the periphery of the side face in the axial direction of the cylinder 141, a pair of the hollow cylindrical exciting solenoid coils 147 surrounding the side of the cylinder 141 are provided on both sides of the cylinder 141. The pair of solenoid coils 147 are juxtaposed in the axial direction of the cylinder 141 in close formation.

In the solenoid coil 147, the lead wire is wound round the coil bobbin 148. The inner diameter of the coil bobbin 148 is slightly larger than the outer diameter of the cylinder 141. The solenoid coil 147 is fixed to the cylinder cap 155, which is located at both end portions of the fluid drive unit 110, so that the coil bobbin 148 can not come into contact with the side of the cylinder 141.

In this connection, the outer circumference of the solenoid coil 147 is covered with the cylindrical case 150. The lead wire composing the solenoid coil 147 is drawn outside via the drawing portion, not shown in the drawing, and connected to the drive circuit 153.

A cylinder cap 155 is provided at each end portion of the fluid drive unit 110 and connected with the connecting pipe 131 and the cylinder 141. Each cylinder cap 155 is composed of a first cap composing member 156 and a second composing member 157.

The first cap composing member 156 includes: a hole 156a, the diameter of which is slightly larger than the outer diameter of the cylinder 141; a first engaging portion 156b engaged with the solenoid coil 147; and a second engaging portion 156c engaged with the second cap composing member 157. While the hole 156a of the first cap composing member 156 is accommodating an end portion of the cylinder 141, the first cap composing member 156 is connected with the solenoid coil 147 by the first engaging portion 156b.

When the second cap composing member 157 is engaged with the second engaging portion 156c of the first cap composing member 156, the first cap composing member 156 is positioned in the condition wherein the first cap composing member 156 is not in contact with the side of the cylinder 141. At this time, the solenoid 147 fixed to the first cap composing member 156 is placed in a state in which the solenoid 147 is not in contact with the side of the cylinder 141, and a predetermined gap is formed between the cylinder 141 side and the solenoid coil 147 and between the cylinder 141 side and the first cap composing member 156.

The second cap composing member 157 is provided with an inserting portion 157a protruding from the main body portion, the diameter of which is the same as that of the first cap composing member 156. The inserting portion 157a is inserted into the cylinder 141 from the opening end of the cylinder 141 and engaged with the cylinder 141. In this way, the inserting portion 157a is accommodated inside the cylinder 141. The diameter of this inserting portion 157a is slightly smaller than the inner diameter of the cylinder 141. The inserting portion 157a has a groove 157b for accommodating O-ring 158 in the engaging portion with the cylinder 141. O-ring 158 provided between the inner wall of the cylinder 141 and the outer wall of the inserting portion 157a functions as an elastic sealing member for preventing the fluid 5, which is charged into the cylinder 141, from flowing outside. At the same time, O-ring 158 prevents an external force (twisting force), which acts on the second cap composing member 157, from affecting the cylinder 141 when the second cap composing member 157 is attached. In this connection, the second cap composing member 157 of this embodiment is fixed in the cylinder 141 by the elastic force generated by O-ring 158.

The second cap composing member 157 is provided with a connecting portion 157c, the profile of which is like an opening, connected to the connecting pipe 131. The second cap composing member 157 is also provided with a through-hole 157d forming a passage from the connecting portion 157c to the end portion of the inserting portion 157a on the piston 143 side. By way of this through-hole 157d, the space in the cylinder 141 charged with the fluid 5, the connecting pipe 131 and the passage 23 of the heat transport device body 21 can communicate with each other.

The inserting portion 157a is provided with a stopper attaching portion 157e engaged with the cylindrical stopper 159. The diameter of the stopper attaching portion 157e is smaller than the diameter of the other portion of the inserting portion 157a by a size corresponding to the thickness of the stopper 159.

The stopper 159 is engaged with the stopper attaching portion 157e and fixed to the second cap composing member 157. The stopper 159 is made of rubber and absorbs vibration generated in the cylinder 141 when the piston 143 is reciprocating, especially if the piston 143 has stepped out. Due to the foregoing, the vibration sound generated by the reciprocating motion of the piston 143 can be suppressed. In this connection, the material of the stopper 159 is not limited to rubber. The stopper 159 may be made of resin, for example, it may be made of Teflon (trademark). Alternatively, it may be made of both rubber and metal.

Next, the constitution of the piston 143 will be explained below. FIGS. 12A, 12B and 12C are schematic illustrations showing the constitution of the piston 143 provided in the cylinder 141. FIG. 12A is a plan view of the piston 143, FIG. 12B is a sectional view showing an outline of the constitution of the cross section perpendicular to the longitudinal direction of the piston 143, and FIG. 12C is a sectional view showing an outline of the constitution of the cross section in the longitudinal direction of the piston 143.

The piston 143 includes: a permanent magnet 171, the profile of which is columnar; a cylindrical accommodating body 173 for accommodating the permanent magnet 171; and a pair of end portion forming bodies 175 arranged on both sides of the permanent magnet 171 in the axial direction and opposed to each other. The cylindrical accommodating body 173 is made of metal such as stainless steel, and the profile of the cylindrical accommodating body 173 is a hollow cylinder. The cylindrical accommodating body 173 is provided with a nickel phosphorus plated layer 173a which is a sliding member arranged over the entire side face of the cylindrical accommodating body 173 coming into contact with the inner wall of the cylinder 141. The outer diameter of the cylindrical accommodating body 173 is substantially the same as the inner diameter of the cylinder 141. The sliding face of this piston 143 is composed of a nickel phosphorus plated layer 173a.

The diameter of the permanent magnet 171 accommodated in this cylindrical accommodating body 173 is smaller than the inner diameter of the cylindrical accommodating body 173. The length of the permanent magnet 171 in the axial direction is slightly less than the cylindrical accommodating body 173 in the axial direction. The thus composed permanent magnet 171 is arranged in a manner such that the magnetic poles (N-pole and S-pole) are arranged in the opening portions of the cylindrical accommodating body 173, and the permanent magnet 171 is accommodated in the central portion of the cylindrical accommodating body 173. At the end portion of the cylindrical accommodating body 173, the end portion forming body 175 is engaged so that the end portion forming body 175 can contact an end face of the permanent magnet 171.

The end portion forming body 175 is made of magnetic material (ferromagnetic material) such as iron. When the end portion forming body 175 is placed in a magnetic field, the end portion forming body 175 is affected by the magnetic field and temporarily magnetized, and thus functions as a temporary magnet. The end portion forming body 175 is formed in a substantial columnar shape. One end of the end portion forming body 175 is provided with a small diameter portion 175a engaged with the cylindrical accommodating body 173, and the diameter of the other end of the end portion forming body 175 is larger than the outer diameter of the permanent magnet 171 and slightly smaller than the outer diameter of the cylindrical accommodating body 173.

Length L2 of the end portion forming body 175 in the axial direction is shorter than length L1 of the solenoid coil 147 in the axial direction. Specifically, length L2 of the end portion forming body 175 in the axial direction is 25% of length L1 of the solenoid coil 147 in the axial direction.

On the side face of the end portion forming body 175, the spiral groove 175b is formed which extends from the end portion, in which the small diameter portion 175a is formed, to the other end portion (the end portion of the piston 143). Specifically, a plurality of spiral grooves 175b are formed in a manner such that the spiral grooves 175b turns on the side of the end portion forming body 175 in the axial direction.

The small diameter portion 175a of the thus composed end portion forming body 175 is engaged with the cylindrical accommodating body 173 in which the permanent magnet 171 is accommodated, and the grooves 175b are arranged spirally from the end portion of the cylindrical accommodating body 173 toward the end of the piston 143 when assembling of the piston 143 is completed.

The cylindrical accommodating body 173, the permanent magnet 171 and the end portion forming body 175 are bonded and fixed to each other with adhesive made of epoxy resin. In this case, all gaps in the cylindrical accommodating body 173 are filled with adhesive so that the permanent magnet 171 can be positively fixed in the cylindrical accommodating body 173 and the permanent magnet 171 cannot contact the fluid 5. In this connection, the cylindrical accommodating body 173 and the end portion forming body 175 may be joined and fixed to each other by means of welding.

The thus composed fluid drive unit 110 is operated as follows. The drive circuit 153 impresses AC voltage upon the solenoid coil 147, so that magnetic fluxes in the positive and the negative direction can be alternately and periodically generated in the cylinder 141 in the axial direction of the cylinder 141. Due to the foregoing, the piston 143, in which the permanent magnet 171 having N-pole in one end portion in the axial direction of the cylinder 141 and also having S-pole in the other portion is built, is slid in the direction of the magnetic flux and periodically reciprocated by the magnetic force at the vibration center of the boundary position of the pair of the solenoid coil 147.

In this case, the piston 143 of the present embodiment is vibrated in region PR1 inside the cylinder 141 surrounded by the pair of the solenoid coils 147. Specifically, the piston 143 of the present embodiment is vibrated in region PR1 surrounded by the end portion of one solenoid coil 147 on the cylinder cap 155 side (the passage 23 side) and the end portion of the other solenoid coil 147 on the cylinder cap 155 side (the passage 23 side).

When the piston 143 is reciprocated, the fluid 5, the volume of which corresponds to the movement of the piston, is discharged from one end of the cylinder 141. The thus discharged fluid 5 flows into one end of the passage 23 of the heat transport device body 21, and the same volume of the fluid 5 is discharged from the other end of the passage 23. By this principle, the fluid 5 in the heat transport device 120 is vibrated in the direction of the arrow shown in FIG. 2 (the direction of the passage parallel with the passage 23) in accordance with the reciprocating motion of the piston 143.

Figure 13:
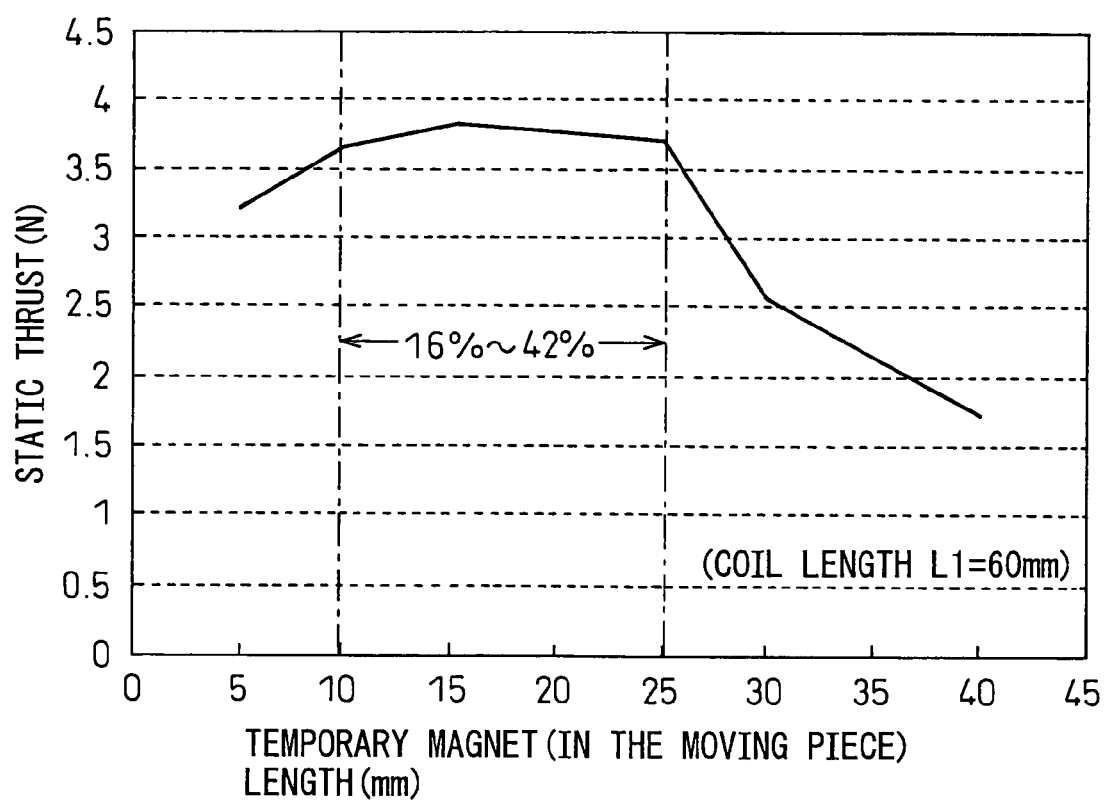
FIG. 13 is a graph showing a relation between the length L2 of the end portion forming body 175 in the axial direction and the thrust directed to the piston by the solenoid coil 147.

FIG. 13 is a graph showing a relation between length L2 of the end portion forming body 175 in the axial direction and the thrust directed to the piston 143 by the solenoid coil 147. In this connection, this graph shows a result of measurement in which static thrust is directed to the piston 143 by the solenoid coil 147 in the case where the piston 143 is stopped.

FIGS. 14A, 14B and 14C are graphs in which the vibration center is determined to be the zero point, and the piston position with respect to the vibration center is shown on the axis of abscissa. In the case where the piston is located at the position, the intensity of thrust directed to the piston is shown on the axis of ordinate. FIG. 14A is a graph relating to the case where length L2 of the end portion forming body 175 in the axial direction is greater than the appropriate value, FIG. 14B is a graph relating to the case where length L2 of the end portion forming body 175 in the axial direction is the appropriate value, and FIG. 14C is a graph relating to the case where length L2 of the end portion forming body 175 in the axial direction is less than the appropriate value.

As shown in FIG. 13, the intensity of thrust directed to the piston 143 becomes maximum in the case where length L2 of the end portion forming body 175 in the axial direction is 25% of length L1 of the solenoid coil 147. When length L2 of the end portion forming body 175 in the axial direction is set at 25% of length L1 of the solenoid coil 147, the piston 143 can be efficiently driven by low-intensity electric power. Accordingly, when length L2 of the end portion forming body 175 in the axial direction is set at 25% of length L1 of the solenoid coil 147, the fluid drive unit can be reduced in size and electric power consumption can be reduced.

As can be understood from FIG. 13, the intensity of thrust obtained in the case where length L2 of the end portion forming body 175 in the axial direction is set at 16% to 42% of length L1 of the solenoid coil 147 becomes substantially maximum. Therefore, when length L2 of the end portion forming body 175 in the axial direction is set at 16% to 42% of length L1 of the solenoid coil 147, the substantially same effect as that of the present embodiment can be obtained.

When length L2 of the end portion forming body 175 in the axial direction is too big or small, it is impossible to direct to the piston a uniform intensity of thrust irrespective of the position of the piston. However, when length L2 of the end portion forming body 175 in the axial direction is set at 16% to 42% of length L1 of the solenoid coil 147, as shown in FIG. 14B, a substantially constant intensity of thrust can be directed in all regions of the sliding range of the piston (the axis of abscissa shown in the graph—A to A) irrespective of the position of the piston. Therefore, according to the present embodiment, the piston 143 can be driven with high efficiency.

In this connection, when length L2 of the end portion forming body 175 in the axial direction is greater than the appropriate value, an intensity of thrust changes greatly, according to the position of the piston as shown in FIG. 14A. The reason the intensity of thrust changes so much according to the position of the piston is that when the length of the end portion forming body 175 is increased, the end portion forming body 175 is strongly affected by the magnetic field of the solenoid coil 147, which is different from the solenoid coil 147 surrounding the end portion forming body 175 itself, at the time of reciprocation of the piston.

When length L2 of the end portion forming body 175 in the axial direction is much less than the appropriate value, as shown in FIG. 14C, the intensity of thrust is greatly reduced in the neighborhood of the turning point (point A—point A). The reason the intensity of thrust is so reduced in the neighborhood of the turning point is that it becomes impossible for the end portion forming body 175 to reduce the influence of fluctuation of the magnetic field distribution generated between the center of the solenoid coil 147 and the end portion.

Explanations above relate to the constitution of the heat transport system 101 and the fluid drive unit 110. In the present embodiment, when the piston 143 is reciprocated in the cylinder 141 communicates with both end portions 23a, 23b of the passage 23 formed in the heat transport device body 21, the fluid 5 charged in the passage 23 is vibrated in the passage direction (the directions of arrows x and y shown in FIG. 2). Therefore, the volume of the region in which the fluid 5 is present does not change and thus no cavitation (bubbles) occurs in the fluid 23. Therefore, according to this fluid drive unit 110, vibration, which is a cause of cavitation, and noise can be avoided.

In this embodiment, the solenoid coils 147 are arranged outside the cylinder 141, and the piston 143 is driven by magnetic force. Therefore, it is easy to seal the inside of the cylinder 141 airtightly. Accordingly, the fluid 5 can be prevented from flowing outside. Further, the electronic circuit can be prevented from short-circuiting.

According to the present embodiment, the piston 143 is driven by the magnetic field formed in the solenoid coil 147 without using the yoke. Therefore, no detent force acts on the piston 143, and a uniform thrust can be directed accurately to the piston 143. For the above reasons, according to the fluid drive unit 110 of the present embodiment, the piston 143 can be driven appropriately and accurately by the piston 143.

According to the present embodiment, when the permanent magnet 171 composing the piston 143 is accommodated in the cylindrical accommodating body 173, the profile of the piston 143 is not affected by dimensional errors in the permanent magnet 171, and thus the dimensional tolerances of the permanent magnet 171 can be increased. Therefore, according to the present embodiment, the manufacturing cost can be reduced.

According to the present embodiment, when the permanent magnet 171 is accommodated in the cylindrical accommodating body 173, the permanent magnet 171 is prevented from coming into contact with the fluid 5. Accordingly, it is possible to prevent the permanent magnet 171 from being corroded by the fluid 5. Therefore, according to the present embodiment, the durability of the fluid drive unit 110 can be enhanced.

According to the present embodiment, when the spiral grooves 175b are formed from the region, in which the sliding member (the nickel phosphorus plated layer) is provided on the surface of the piston 143, toward both end portions of the piston 143 in the axial direction, abrasion powder of the piston 143 can be prevented from remaining in the neighborhood of the vibration center of the piston 143. Therefore, according to this fluid drive unit 110, there is no possibility of the piston 143 not sliding smoothly by reason of abrasion powder remaining in the neighborhood of the vibration center of the piston 143. Thus, there is almost no possibility of the operation of the piston being unintentionally stopped.

In the present embodiment, the second cap composing member 157, which is a passage connecting member for connecting the connecting pipe 131 with the cylinder 141, is fixed in the cylinder 141 by an elastic force of O-ring 158. Therefore, according to the present embodiment, it is possible to solve the problem in which a strong external force (twisting force) acts on the cylinder 141 when the second cap composing member 157 is attached to the cylinder 141 and the cylinder 141 is deformed and damaged.

According to the present embodiment, since the solenoid coil 147 is arranged distant from the side of the cylinder 141 in the axial direction, heat generated from the solenoid coil 147 is not conducted to the cylinder 141. Therefore, deterioration in the performance of the heat transport system 101 can be satisfactorily prevented.

According to the present embodiment, the cross-sectional area of the cylinder 141 is made larger than that of the passage 23. Therefore, the amplitude of the fluid 5 in the passage 23 can be made larger than that of the piston 143. As a result, the heat transport performance of the heat transport system 101 can be greatly enhanced. When the heat transport device 120 is used in the present embodiment, the same effect as that of the first embodiment described above can be provided in the heat transport system 101.

In this connection, in the present embodiment, the heat transport body corresponds to the heat transport device 120. The drive means includes: a pair of solenoid coils 147; and a drive circuit 153 for driving the solenoid coils 147. The vibration sound suppressing member corresponds to the stopper 159.

In the fluid drive unit 110, it is possible to use another piston instead of the above piston 143. FIGS. 15A, 15B and 15C are schematic illustrations showing the constitution of the piston 180 of the first variation. FIG. 15A is a plan view showing the constitution of the piston 180, FIG. 15B is a sectional view showing an outline of the constitution of the cross section perpendicular to the longitudinal direction of the piston 180, and FIG. 15C is a sectional view showing an outline of the constitution of the cross section in the longitudinal direction of the piston 180.

The piston 180 of the first variation is composed in the substantially same manner as that of the piston 143 described above. However, in the piston 180, instead of the end portion forming body 175, the end portion forming body 185 having a groove of a different profile is used. In this case, the piston 180 includes: a permanent magnet 171, the constitution of which is the same as that of the piston 143; a cylindrical accommodating body 173 for accommodating the permanent magnet 171; and a pair of end portion forming bodies 185 arranged on both sides of the permanent magnet 171.

The permanent magnet 171 is arranged in a manner such that the magnetic poles (N-pole and S-pole) are arranged in the opening portions of the cylindrical accommodating body 173, and the permanent magnet 171 is accommodated in the central portion of the cylindrical accommodating body 173. At the end portion of the cylindrical accommodating body 173, the end portion forming body 185 is engaged so that it can contact an end face of the permanent magnet 171.

The end portion forming body 185 is made of magnetic material (ferromagnetic material) such as iron, and functions as a temporary magnet. The end portion forming body 185 is formed into a substantial columnar shape, one end of which is provided with a small diameter portion 185a engaged with the cylindrical accommodating body 173. Length L2 of the end portion forming body 185 in the axial direction is less than length L1 of the solenoid coil 147 in the axial direction. Specifically, length L2 of the end portion forming body 185 in the axial direction is 25% of length L1 of the solenoid coil 147 in the axial direction.

On the side of the end portion forming body 185, a plurality of grooves 185b extending in parallel with the axial direction of the piston 180 are formed from the end portion, in which the small diameter portion 185a is formed, to the other end portion. The end portion forming body 185 is engaged with the cylindrical accommodating body 173, in which the permanent magnet 171 is accommodated, in the small diameter portion 185a.

Accordingly, in the state wherein assembling of the piston 180 is completed, the groove 185b is arranged linearly from the end portion of the cylindrical accommodating body 173 toward the end portion of the piston 143 concerned; in other words, from the central portion of the piston 180 toward the end portion of the piston 180. Compared with the piston 143, in the piston 180 composed as described above, the groove 185b can be easily machined. Therefore, the piston 180 composed as described above is advantageous in that the manufacturing cost can be reduced.

FIGS. 16A, 16B and 16C are schematic illustrations showing the constitution of the piston 190 of the second variation. In this connection, FIG. 16A is a plan view showing the constitution of the piston 190, FIG. 16B is a sectional view showing an outline of the constitution of the cross section of the piston 190 in the longitudinal direction, and FIG. 16C is a sectional view showing an outline of the constitution of the cross section of the piston 190 perpendicular to the longitudinal direction.

The piston 190 of the second variation includes piston body 193 in which a pair of end portion forming bodies 195 composing both end portions of the piston 190 and the connecting body 194 for connecting the end portion forming bodies 195 are integrated into one body. The piston 190 of the second variation also includes a pair of permanent magnet split bodies 191, the cross-section in the direction perpendicular to the axial direction of which is semicircular.

The end portion forming body 195 is made of magnetic material (ferromagnetic material) such as iron. The end portion forming body 195 functions as a temporary magnet. The end portion forming body 195 is formed into a substantial columnar shape, and is provided with a small diameter portion 195a for accommodating the cylindrical sliding member 192 on the connecting body 194 side.

The outer diameter of the end portion forming body 195 is slightly smaller than the inner diameter of the cylinder 141. Length L2 of the end portion forming body 195 in the axial direction is 25% of length L1 of the solenoid coil 147 in the axial direction. The length of the small diameter portion 195a in the axial direction is substantially the same as the length of the sliding member 192 in the axial direction. The outer diameter of the sliding member 192 is substantially the same as the inner diameter of the cylinder 141. In the piston 190 concerned, the sliding face is composed of sliding members 192 which are arranged symmetrically on both sides of the piston 190 in the axial direction.

In the end portion forming body 195, the spiral groove 195b extending from the small diameter portion 195a to the end portion on the opposite side to the connecting body 194 side, i.e. extending to the end portion of the piston 190 is formed. Specifically, the groove 195b is formed in a manner such that it turns round the end portion forming body 195.

On the other hand, the diameter of the connecting body 194 is smaller than the diameter of the end portion forming body 195. Specifically, the radius of the end portion forming body 195 is slightly larger than the length which is obtained when the thickness of the permanent magnet split body 191 in the radial direction is added to the radius of the connecting body 194. A pair of the permanent magnet split bodies 191 are bonded to the connecting body 194. When the pair of the permanent magnet split bodies 191 are put on each other, a cylindrical permanent magnet can be composed, the inner diameter of which is substantially the same as the outer diameter of the connecting body 194, and the outer diameter of which is slightly smaller than the outer diameter of the end portion forming body 195.

When the pair of the permanent magnet split bodies 191 is attached to the circumference of the connecting body 194 in the piston body 193 composed as described above, the piston 190 is completed. In the thus completed piston 190, the permanent magnet split bodies 191 are arranged at the central side of the piston 190 with respect to the face (the outermost face of the end portion forming body 195) connecting the side faces of the pair of the end portion composing bodies 195 in the radial direction perpendicular to the sliding direction (the axial direction of the piston 190) of the piston 190.

According to the piston 190 composed as described above, assembling is easy to carry out. Therefore, the product is simple to manufacture. Further, since the permanent magnet split bodies 191 do not contact the cylinder 141, it is possible to increase the dimensional tolerances of the permanent magnet split bodies 191, and thus the reliability of the product can be enhanced.

In this connection, in the piston 190, the sliding member 192 protrudes from the end portion forming body 195. However, instead of the sliding member 192, the side of the end portion forming body 195 may be plated with nickel phosphorus. FIGS. 17A, 17B and 17C are schematic illustrations showing the constitution of a variation of piston 190'. FIG. 17A is a plan view showing the constitution of the piston 190', FIG. 17B is a sectional view showing an outline of the constitution of the cross section of the piston 190' in the longitudinal direction, and FIG. 17C is a sectional view showing an outline of the constitution of the cross section of the piston 190' in the direction perpendicular to the longitudinal direction.

The variation of piston 190' has no small diameter portion 195a in the end portion forming body 195', but has nickel phosphorus plated layer 196 on the side face of the end portion forming body 195' instead of the sliding member 192. Except for the above points, the constitution of the variation of piston 190' is substantially the same as the constitution of the above piston 190.

In the piston 190', the nickel phosphorus plated layer 196, which is used as the sliding member, is formed on the side face of the end portion forming body 195' by means of plating. Therefore, the piston 190' can be more easily manufactured than the piston 190.

FIGS. 18A and 18B are schematic illustrations showing the constitution of the piston 200 of the third variation. In this connection, FIG. 18A is a plan view showing the constitution of the piston 200, and FIG. 18B is a sectional view showing an outline of the constitution of the cross section of the piston 200 in the longitudinal direction.

The piston 200 of the third variation includes: a columnar permanent magnet 201; and a pair of end portion forming bodies 205, which are arranged on both end portions of the permanent magnet 201 in the axial direction, for composing the end portions of the piston 200.

The end portion forming body 205 is made of magnetic material (ferromagnetic material) such as iron. The end portion forming body 205 functions as a temporary magnet. The end portion forming body 205 is formed in a substantial columnar shape. The end portion forming body 205 has a small diameter portion 205a for accommodating the cylindrical sliding member 202 on the permanent magnet 201 side.

The outer diameter of the end portion forming body 205 is slightly smaller than the inner diameter of the cylinder 141. Length L2 of the end portion forming body 205 in the axial direction is 25% of length L1 of the solenoid coil 147 in the axial direction. The length of the small diameter portion 205a in the axial direction is substantially the same as the length of the sliding member 202 in the axial direction. The outer diameter of the sliding member 202 is substantially the same as the inner diameter of the cylinder 141. In the piston 200 concerned, the sliding face is composed of the sliding members 202 which are symmetrically arranged on both sides of the piston 200 in the axial direction.

In the end portion forming body 205, the spiral groove 205b extending from the small diameter portion 205a to the end portion of the piston 200 is formed. Specifically, the groove 205b is formed in a manner such that it turns around the end portion forming body 205. The diameter of the permanent magnet 201 is smaller than the diameter of the end portion forming body 205, and is pivotally connected to the end portion forming bodies 205 on the end faces on both sides of the permanent magnet 201 in the axial direction so that the permanent magnet 201 can be rotated with respect to the end portion forming bodies 205 by a predetermined angle.

According to the piston 200 composed as described above, since the end portion forming bodies 205 and the permanent magnet 201 are pivotally connected to each other, the end portion forming bodies 205 can slide smoothly on the inner wall of the cylinder 141. Accordingly, when the piston 200 is used, it is possible to manufacture a fluid drive unit, the performance of which is high. Further, it is satisfactory that the diameter of the permanent magnet 201 be smaller than that of the end portion forming body 205. Therefore, dimensional errors in the permanent magnet 201 can be permitted to a certain extent. Thus, according to this embodiment, the dimensional tolerances of the permanent magnet 201 can be increased, and the manufacturing cost reduced.

In this connection, in the same manner as that of the piston 190, in the piston 200, a nickel-phosphorus-plated layer may be formed on the side of the end portion forming body 205 instead of using the sliding member 202. FIGS. 19A and 19B are schematic illustrations showing the constitution of a variation of the piston 200'. FIG. 19A is a plan view showing the constitution of the piston 200', and FIG. 19B is a sectional view showing an outline of the constitution of the piston 200' in the longitudinal direction.

The variation of piston 200' has no small diameter portion 205a in the end portion forming body 205', but has a nickel phosphorus plated layer 206 on the side face of the end portion forming body 205' instead of the sliding member 202. Except for the above points, the constitution of variation of the piston 200' is substantially the same as the constitution of the above piston 200.

In the piston 200', the nickel phosphorus plated layer 206, which is used as the sliding member, is formed on the side face of the end portion forming body 205' by means of nickel plating. Therefore, the piston 200' can be more easily manufactured than the piston 200.

In this connection, length L2 of the end portion forming bodies of the above pistons 180, 190, 190', 200 and 200' in the axial direction need not be 25% of length L1 of the solenoid coil 147 in the axial direction, for the same reason as in the case of the piston 143. Length L2 of the end portion forming bodies may be set at 16% to 42% of length L1 of the solenoid coil 147 in the axial direction.

Figure 20:
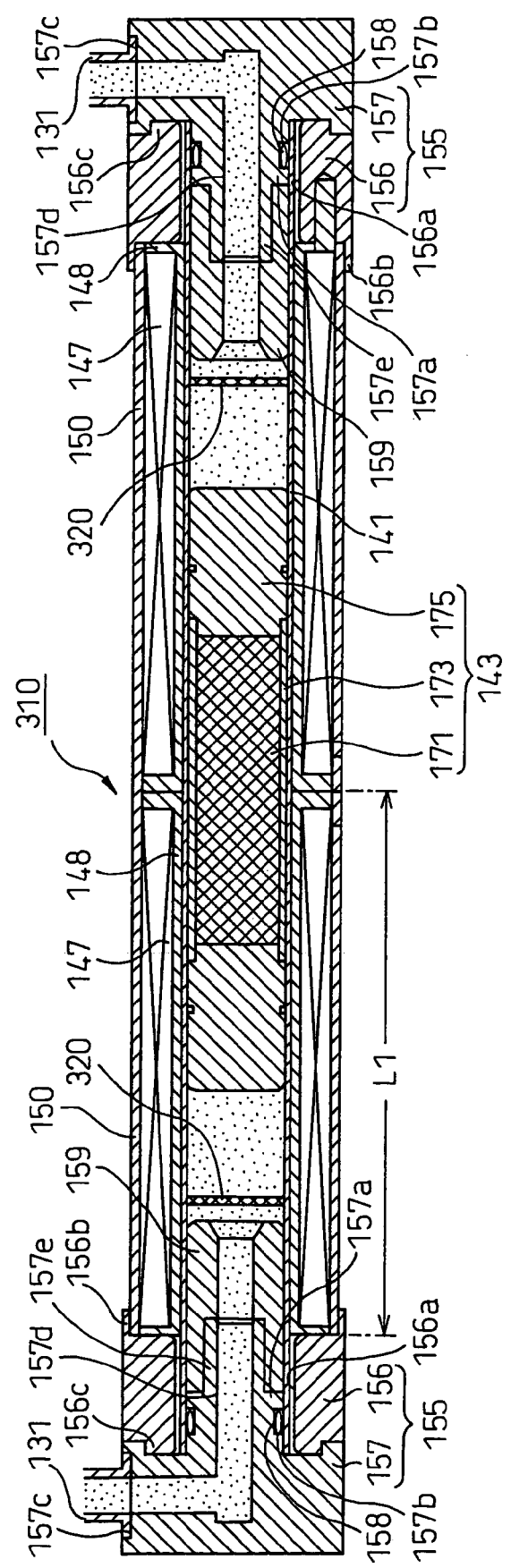
FIG. 20 is a view showing the constitution of the section in the longitudinal direction of the fluid drive unit 310 of the third embodiment.

Next, the third embodiment will be explained below. FIG. 20 is a view showing an outline of the constitution of the section in the longitudinal direction of the fluid drive unit 310 of the third embodiment. The fluid drive unit 310 of the third embodiment composes a heat transport system together with the heat transport device 120 described above. This heat transport system is composed in a manner such that the fluid drive unit 110 shown in FIG. 8 is replaced only with the fluid drive unit 310. Therefore, the constitution of the heat transport system, in which the fluid drive unit 310 is provided, is not shown here.

The fluid drive unit 310 of the third embodiment is composed in a manner such that the filter 320 is provided in the fluid drive unit 110 of the second embodiment. The fluid 5 can pass through the filter 320. However, abrasion powder, which is generated by abrasion of the piston 143, cannot pass through the filter 320. A pair of the filters 320 are arranged in the cylinder 141.

Each filter 320 is arranged at a position on the piston 143 side with respect to the stopper 159 being located outside the sliding range of the piston 143 to the end side. Each filter 320 prevents the abrasion powder, which is generated by wear of the piston 143, from entering the passage 5 via the hole of the stopper 159. According to the fluid drive unit 310 having the filters 320, no abrasion powder remains in the passage 5. Therefore, the durability of the heat transport system can be enhanced. In other words, according to the third embodiment, it is possible to provide a highly reliable product.

Even in the fluid drive unit 310 of the third embodiment, instead of the piston 143, it is possible to use the pistons 180, 190, 190', 200 and 200' which are introduced as variations of the fluid drive unit 110 of the second embodiment. In this connection, length L2 of the end portion forming bodies in the axial direction need not be 25% of length L1 of the solenoid coil 147 in the axial direction. Length L2 of the end portion forming bodies may be set at 16% to 42% of length L1 of the solenoid coil 147 in the axial direction.

Figure 21:
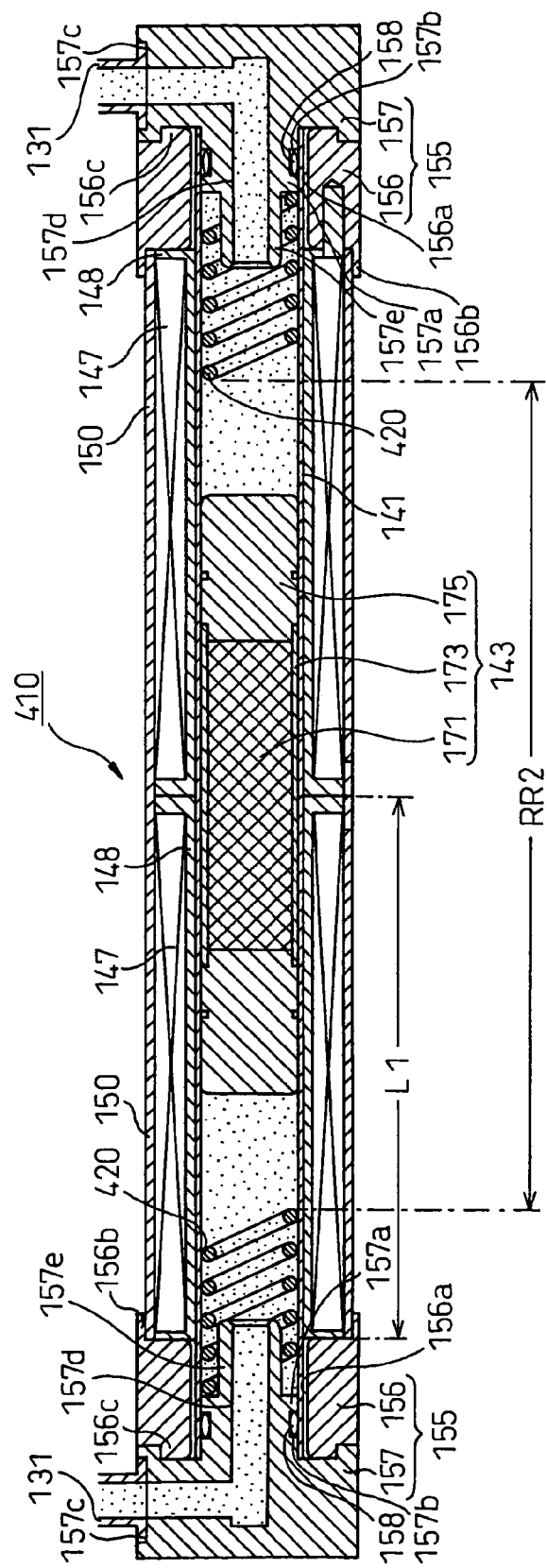
FIG. 21 is a view showing the constitution of the section in the longitudinal direction of the fluid drive unit 410 of the fourth embodiment.
Figure 22:
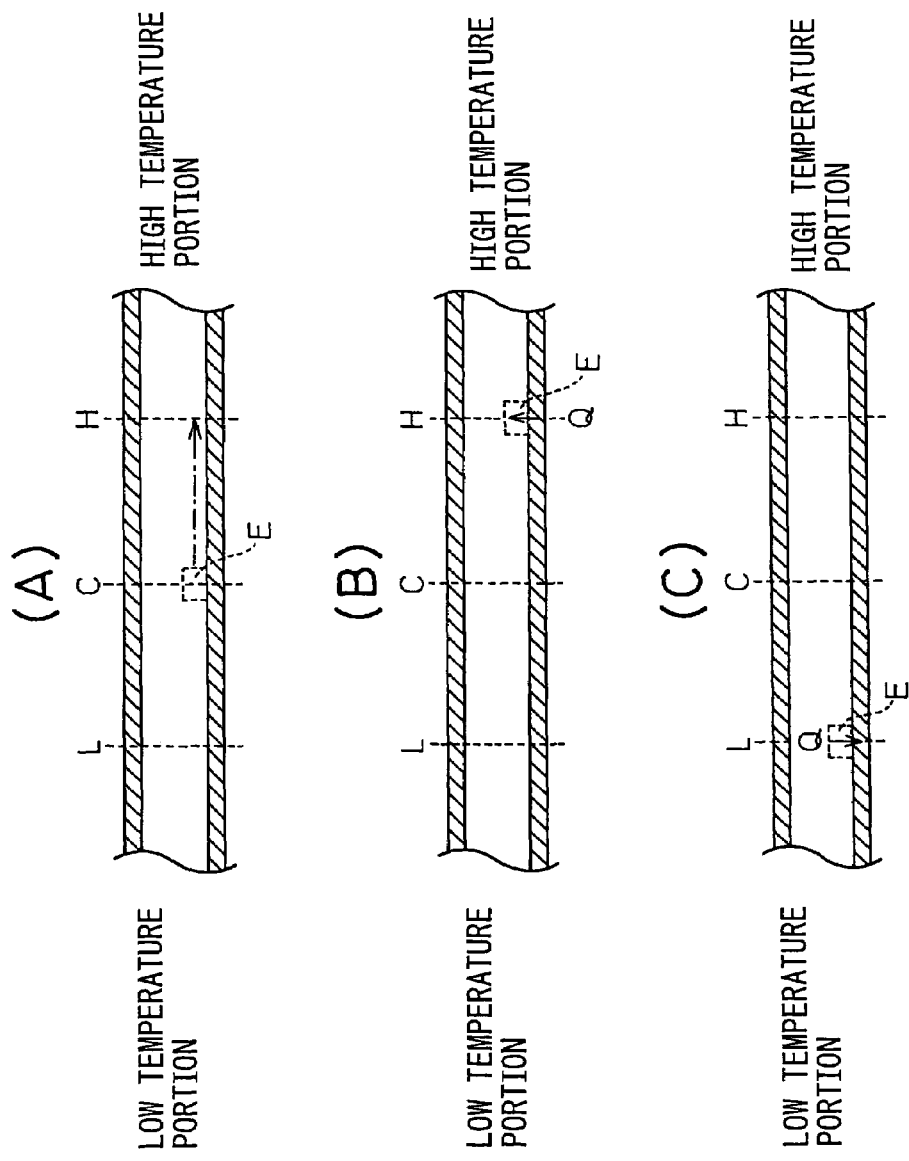
FIGS. 22A, 22B and 22C are schematic illustrations relating to the principle of heat transport.
Figure 24:
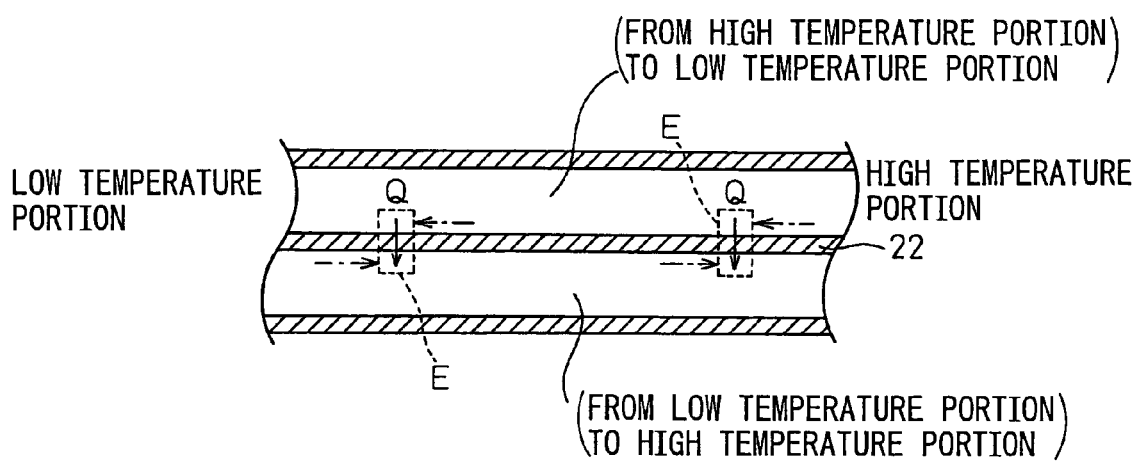
FIG. 24 is a schematic illustration showing the principle of heat transport in the heat transport system of the opposed vibration flow type.

Next, the fourth embodiment will be explained below. FIG. 21 is a sectional view showing an outline of the constitution of the section in the longitudinal direction of the fluid drive unit 410 of the fourth embodiment. The fluid drive unit 410 of the fourth embodiment composes a heat transport system together with the heat transport device 120 described above. The heat transport system is composed in a manner such that the fluid drive unit 110 shown in FIG. 8 is replaced only with the fluid drive unit 410. Therefore, the constitution of the heat transport system, in which the fluid drive unit 410 is provided, is not shown here.

In the fluid drive unit 410 of the fourth embodiment, instead of the stopper 159 being provided in the fluid drive unit 110 of the second embodiment, a pair of coil springs 420 are provided. In the case where the piston 143 is driven by magnetic force generated by the solenoid coil 147, there is a possibility that the piston can not be controlled for a time, with the result that the piston moves outside the original sliding range. In this embodiment, in order to reciprocate the piston 143 appropriately, the coil springs 420 are provided on both end sides of the sliding range PR2 of the piston 143, so that the piston 143 can be properly reciprocated in the original sliding range PR2.

In the fluid drive unit 410 of this embodiment, the coil springs 420 for exerting an elastic force in the axial direction of the cylinder 141 are arranged adjacent to the sliding range PR2 of the piston 143. Therefore, the sliding motion of the piston 143 can be restricted in a predetermined range by the coil springs 420, i.e. the piston 143 cannot be moved to the cylinder 141 side beyond the predetermined range.

Therefore, according to the fluid drive unit 410 of the fourth embodiment, the piston can be driven properly at all times, and the performance of the product can be enhanced.

According to the fluid drive unit 410 of the fourth embodiment, since the spring members (the coil springs 420) are used, it is possible to prevent the generation of vibration and noise in the case of step-out.

Even in the fluid drive unit 410 of the fourth embodiment, instead of the piston 143, it is possible to use the pistons 180, 190, 190', 200 and 200', which are introduced as variations of the fluid drive unit 110 of the second embodiment. In this connection, length L2 of the end portion forming bodies in the axial direction need not be 25% of length L1 of the solenoid coil 147 in the axial direction. Length L2 of the end portion forming bodies may be set at 16% to 42% of length L1 of the solenoid coil 147 in the axial direction.

The fluid drive units 10, 110, 310 and 410 of the first to the fourth embodiments and the heat transport systems using the fluid drive units have been explained above. However, it should be noted that the fluid drive unit and the heat transport system of the present invention are not limited to the above specific embodiments, and various variations may be made by those skilled in the art.

For example, the fluid drive units 10, 110, 310 and 410 of the above embodiments are put into practical use mainly for the heat transport system. However, the use of the fluid drive units 10, 110, 310 and 410 of the above embodiments is not limited to the above specific use. In the first embodiment, the yoke 51 and the cylinder 41 are composed differently from each other and a gap is formed between them, so that the cylinder 41 is not subjected to bending stress. However, instead of forming the gap between the yoke 51 and the cylinder 41, the yoke 51 and the cylinder 41 may be composed integrated into one body so that bending stress does not act on the cylinder 41.

Further, a labyrinth seal member may be provided on the circumference of the side of the piston 43, so that the fluid 5 cannot flow out from one end to the other end via the gap formed between the cylinder 41 and the piston 43. When this structure is adopted, the fluid 5 can be vibrated effectively.

While the invention has been described by reference to specific embodiments chosen for the purpose of illustration, it should be apparent that numerous modifications can be made thereto by those skilled in the art without departing from the basic concept and scope of the invention.

The invention claimed is:

1. A fluid drive unit for vibrating fluid charged in a passage in a direction of the passage, comprising:
   a moving piece accommodating portion communicating with both end portions of the passage, a moving piece slidably accommodated in the moving piece accommodating portion, the fluid in the passage being accommodated in spaces interposed between both end portions of the moving piece accommodating portion in the sliding direction of the moving piece and the end portions of the passage; and
   drive means for reciprocating the moving piece in the moving piece accommodating portion in the sliding direction, wherein
   the fluid charged in the passage is vibrated in the passage direction when the moving piece is reciprocated by the drive means;
   the moving piece includes temporary magnets arranged at both end portions in the sliding direction, and a permanent magnet is arranged between the temporary magnets arranged at both end portions, and
   the moving piece includes a cylindrical body for accommodating the permanent magnet, the permanent magnet is accommodated in the cylindrical body, and the temporary magnets are arranged opposed to each other at both end portions of the permanent magnet in the sliding direction of the moving piece, the moving piece comprises a sliding piece provided with a sliding face sliding against the moving accommodation portion, on an outer surface of the sliding piece opposed to the moving piece accommodation portion of the cylindrical body, the drive means reciprocates the moving piece by magnetic force;

a groove is formed on a surface of the moving piece from both end portions of the moving piece in the sliding direction to a central portion; and the groove formed on the surface of the moving piece is a spiral groove turning on the side of the moving piece in the sliding direction.

2. A fluid drive unit according to claim 1, wherein the moving piece accommodating portion is a cylinder communicating with both end portions of the passage, and the moving piece is a piston reciprocating in the cylinder in the axial direction of the cylinder which is the sliding direction of the moving piece.

3. A fluid drive unit according to claim 1, wherein the sliding piece is arranged in the periphery of the magnetic body, and the drive means reciprocates the moving piece by magnetic force imparted to the magnetic body.

4. A fluid drive unit according to claim 1, wherein the drive means includes an annular exciting coil surrounding a side of the moving piece accommodating portion in the sliding direction of the moving piece, a magnetic flux is formed in the moving piece accommodating portion by the exciting coil, and the moving piece is reciprocated by magnetic force generated by the exciting coil.

5. A fluid drive unit according to claim 1, wherein the drive means includes a pair of annular exciting coils surrounding a side of the moving piece accommodating portion in the sliding direction of the moving piece, the pair of annular exciting coils are arranged parallel to each other in the sliding direction of the moving piece, and the moving piece is reciprocated by a magnetic force generated by the pair of exciting coils.

6. A fluid drive unit according to claim 5, wherein the moving piece is reciprocated in the moving piece accommodating portion in a region surrounded by the end portion of one exciting coil on the passage side and by the end portion of the other exciting coil on the passage side.

7. A fluid drive unit according to claim 5, wherein the length of each temporary magnet in the moving piece sliding direction is less than the length of the exciting coil in the moving piece sliding direction.

8. A fluid drive unit according to claim 7, wherein the length of each temporary magnet in the moving piece sliding direction is 16% to 42% of the length of the exciting coil in the moving piece sliding direction.

9. A fluid drive unit according to claim 8, wherein the length of each temporary magnet in the moving piece sliding direction is 25% of the length of the exciting coil in the moving piece sliding direction.

10. A fluid drive unit according to claim 1, wherein the permanent magnet is arranged on the central side of the moving piece with respect to the outermost face of the temporary magnet in the radial direction perpendicular to the moving piece sliding direction.

11. A fluid drive unit according to claim 1, wherein the moving piece is composed in a manner such that the temporary magnets are pivotally arranged at both end portions of the permanent magnet.

12. A fluid drive unit according to claim 1, further comprising:

a passage connecting member engaged with an opening end of the moving piece accommodating portion, for connecting an end portion of the passage with the moving piece accommodating portion so that the passage and the moving piece accommodating portion can communicate with each other;

an elastic sealing member provided in an engaging portion of the passage connecting member with the moving piece accommodating portion, wherein the passage connecting member is fixed to the moving piece accommodating portion by an elastic force of the elastic sealing member.

13. A fluid drive unit for vibrating fluid charged in a passage in a direction of the passage, comprising:

a moving piece accommodating portion communicating with both end portions of the passage, a moving piece slidably accommodated in the moving piece accommodating portion, the fluid in the passage being accommodated in spaces interposed between both end portions of the moving piece accommodating portion in the sliding direction of the moving piece and the end portions of the passage;

a drive means for reciprocating the moving piece in the moving piece accommodating portion in the sliding direction, a passage connecting member engaged with an opening end of the moving piece accommodating portion, for connecting an end portion of the passage with the moving piece accommodating portion so that the passage and the moving piece accommodating portion can communicate with each other; and an elastic sealing member provided in an engaging portion of the passage connecting member with the moving piece accommodating portion, wherein the fluid charged in the passage is vibrated in the passage direction when the moving piece is reciprocated by the drive means;

the moving piece includes a magnetic body, and the drive means reciprocates the moving piece by magnetic force imparted to the magnetic body;

the drive means includes an annular exciting coil surrounding a side of the moving piece accommodating portion in the sliding direction of the moving piece, a magnetic flux is formed in the moving piece accommodating portion by the exciting coil, and the moving piece is reciprocated by magnetic force generated by the exciting coil;

the passage connecting member is fixed to the moving piece accommodating portion by an elastic force of the elastic sealing member, and the exciting coil is fixed by the passage connecting member so that a gap can be formed between the exciting coil and the side of the moving piece accommodating body.

14. A fluid drive unit according to claim 1, wherein a vibration sound suppressing member for suppressing the vibration sound generated by the reciprocating motion of the moving piece is provided in the moving piece accommodating portion.

15. A fluid drive unit according to claim 1, wherein a spring member for restricting the sliding range of the moving piece is provided in the moving piece accommodating portion.

16. A fluid drive unit according to claim 1, wherein the area of the cross section of the moving piece accommodating portion in the direction perpendicular to the moving piece sliding direction is larger than an area of the cross section of the passage.

17. A heat transport system comprising:
a fluid drive unit described in claim 1; and a heat transport body having a passage communicating with the moving piece accommodating portion of the fluid drive unit, wherein heat is exchanged with the fluid vibrating in the passage when the fluid drive unit is operated so as to transport heat, which is supplied from an external heat source, to a low temperature portion.

18. A heat transport system according to claim 17, wherein the heat transport body is composed in a manner such that the moving directions of the fluid in the passages, which are adjacent to each other, are opposite to each other, the heat transport body exchanges heat with the fluid vibrating in the passage when the fluid drive unit is operated, so that heat of the fluid is transported to the fluid in the adjacent passage and heat supplied from an external heat source to the fluid is transported to a low temperature portion.

19. A fluid drive unit according to claim 1, wherein the spiral groove is only formed on the temporary magnets.

* * * * *